United States Patent [19]
Taki et al.

[11] Patent Number: 5,733,405
[45] Date of Patent: Mar. 31, 1998

[54] PLASMA PROCESSING APPARATUS

[75] Inventors: Masakazu Taki; Hiroki Ootera; Tatsuo Oomori, all of Tokyo, Japan

[73] Assignee: Mitsubishi Denki Kabushiki Kaisha, Tokyo, Japan

[21] Appl. No.: 597,182

[22] Filed: Feb. 6, 1996

[30] Foreign Application Priority Data

Feb. 13, 1995 [JP] Japan ............................ 7-024050
Dec. 27, 1995 [JP] Japan ............................ 7-340682

[51] Int. Cl.$^6$ ................................................ C23F 1/02
[52] U.S. Cl. ............... 156/345; 204/298.37; 204/298.38; 118/723 MR; 118/723 E
[58] Field of Search .............. 156/345; 204/298.38, 204/298.37; 118/723 E, 723 ER, 723 ME, 723 MR, 723 MA

[56] References Cited

U.S. PATENT DOCUMENTS 4,838,978  6/1989  Sekine et al. ................. 118/723 E
5,108,535  4/1992  Ono et al. ...................... 156/345
5,279,669  1/1994  Lee ................................. 156/345

FOREIGN PATENT DOCUMENTS 88182     8/1976  Japan.
64-73725  3/1989  Japan.

Primary Examiner—Thi Dang
Attorney, Agent, or Firm—Sughrue, Mion, Zinn, Macpeak & Seas, PLLC

[57] ABSTRACT

A plasma processing apparatus capable of forming plasma uniformly throughout a large surface area whereby a sample having a large diameter can be uniformly processed. The plasma processing apparatus has a first electrode 3 on which a workpiece 2 is placed, a second electrode 4 located to face the first electrode 3, and a plurality of ring-shaped permanent magnets 11 each having the same polarity in their circumferential direction, and the magnets are disposed concentrically or the outer side of the second electrode 4 so that the polarities opposing in the radial direction of adjacent magnets 11 are opposite to each other.

21 Claims, 18 Drawing Sheets

PLASMA PROCESSING APPARATUS

BACKGROUND OF THE INVENTION

1. Field of the Invention

The present invention relates to a plasma processing apparatus for forming a thin film on a surface of a sample or etching the surface of the sample by utilizing plasma.

2. Discussion of Background

FIG. 15a shows a structural diagram in cross section of a conventional plasma processing apparatus disclosed in, for instance, Japanese Unexamined Patent Publication No. 4952/1990. In FIG. 15a, reference numeral 1 designates a vacuum vessel including a first electrode 3 on which a sample to be etched (hereinbelow, referred to as a workpiece) is placed, and a second electrode 4 disposed so as to oppose the first electrode 3. Gas for etching is introduced into the vacuum vessel 1 through a gas introducing port 5 and the gas is discharged through a discharge port 6. A high frequency electric power source 7 is connected to the first electrode 3 via a matching circuit 8. A permanent magnet 9 is disposed at the side of atmosphere of the second electrode 4. Numeral 10 designates a cooling device; symbol E designates an electric field, and symbol B designates a vector parallel to the first electrode 3 in the magnetic field induced by the permanent magnet 9.

The operation of the conventional apparatus will be described. When the gas for etching is introduced into the vacuum vessel 1 as a plasma chamber through a gas introducing pipe, plasma is produced between the first electrode 3 and the second electrode 4 due to a high frequency electric power applied to the first electrode 3.

The apparatus shown in FIG. 15a is to obtain a high electron density even under a low pressure condition, by a magnetron discharge, and for this purpose, determination is so made that the magnetic flux density at the surface of the first electrode 3 is about 200 Gausses. In this case, in a sheath region (where the plasma contacts the first electrode 3), there causes drifting of charged particles (electrons and ions) in the direction of E×B with a cycloid movement by the effect of a sheathed electric field and a magnetic field. As a result, the probability of impinge between electrons and neutral particles (atoms, molecules) increases to thereby accelerate ionization. Accordingly, plasma of high density is produced even under a low pressure condition and a high etching rate is obtainable. Further, in this case, a loss of plasma is reduced by the magnetic field formed by the permanent magnet 9. Accordingly, the high density plasma can be maintained while the workpiece 2 is etched.

On the other hand, in a conventional technique for processing a workpiece of large diameter such as 8 inches or 10 inches, it has been necessary to form plasma which is uniform throughout a large surface area. However, the conventional apparatus as shown in FIG. 15a which has a structure using a single permanent magnet could not produce a uniform magnetic flux density; namely, it produced an ununiform magnetic flux density in a lateral direction along the surface of the second electrode 4. In other words, the formed magnetic flux density was small at the center and gradually increased toward the outside as shown in FIG. 15b. Thus, it was difficult to form a magnetic field which is uniform to the workpiece. Although a magnetic field equalizing effect could be obtained due to diffusion of plasma, it was difficult to form plasma which is uniform throughout a large surface area. FIG. 15b is a graph showing the distribution of magnetic field in the lateral direction near the surface of the second electrode 4 at a position 35 mm apart from the magnet wherein the magnet has a diameter of 200 mm and a height of 50 mm, and produces a surface magnetic flux density of 3 kG which is uniform throughout the magnet. In FIG. 15b, the ordinate represents the intensity of magnetic field in the lateral direction: $B\perp(G)$, and the abscissa represents the distance from the center: r(mm).

Further, the distribution of the magnetic field near the surface of the workpiece placed on the first electrode 3 also becomes ununiform. Since the movement of the charged particles is substantially influenced by the distribution of magnetic field, the flux of charged particles attracted to the surface of the workpiece becomes ununiform due to the ununiform distribution of magnetic field. As a result, an uneven distribution of charged particles appears near the surface of the workpiece whereby a device to be produced is damaged.

There was proposed to use a plurality of permanent magnets with an arrangement that the polarities of adjacent magnets are the same. Even in this case, the distribution of magnetic field became ununiform in the same manner as the case of using a single magnet, as described above, with the result that uniformity of plasma was insufficient even though the magnetic field equalizing effect due to diffusion of plasma is taken into account.

Further, Japanese Unexamined Patent Publication No. 9452/1990 discloses that a plurality of bar-like permanent magnets are so arranged that the polarities of adjacent magnets are opposite to each other, as shown in FIG. 16a. When the polarities are alternately changed, the distribution in the radial direction of the laterally distributed magnetic flux intensity $B\perp$ near the surface of the second electrode 4 has a wavy form as shown in FIG. 16b. As seen from FIG. 16b, the intensity of magnetic field in the lateral direction $B\perp$ is not uniform in the radial direction. However, the position of peaks can be controlled by changing the distance between the magnets. When plasma is produced in the magnetic field resulting from such an arrangement of the magnets, the plasma is spread to a weak magnetic field portion due to the diffusion of plasma, whereby the plasma can be equalized. Since a loss of plasma can be reduced in comparison with a case without forming the magnetic field, a uniformly formed plasma of high density can be obtained.

However, when a plurality of bar-like permanent magnets are arranged in a parallel relation as shown in FIG. 16a for instance, magnetic fields $B_1$ and $B_2$ are formed. Accordingly, there causes an uneven distribution of plasma in the direction to penetrating the paper surface of the drawing due to E×B drifting of charged particles, which is resulted by an electric field E and a magnetic field $B_1$, in a region (A) near the workpiece. Further, there causes an uneven distribution in the opposite direction from the direction of penetrating the paper surface due to the electric field E and a magnetic field $B_2$ in a region B. Further, in attention to the movement of the charged particles in the sheathed portion near the surface of the second electrode 4, the directions of drifting (E×B drifting) are different in the regions of adjacent magnets as shown by arrow marks in FIG. 17, and a portion having high plasma density is produced in the direction of the drifting to thereby form a portion of high density indicated by hatched lines. Thus, the parallel arrangement of the magnets apt to produce ununiformity in the plasma density, hence, the uniformity of etching rate is deteriorated. This is a fundamental problem of the parallel arrangement of magnets.

FIG. 18 is a structural diagram showing a conventional plasma processing apparatus having a plasma producing chamber and a processing chamber which are formed separately, which is disclosed, for instance, in Japanese Unexamined Patent Publication No. 88182/1976. In FIG. 18, reference numeral 21 designates a processing chamber which is communicated with a diffusion pump 32 and a rotary pump 33 for secondary use through a main valve 31 by which air in the processing chamber is discharged into a vacuum condition. A plasma producing chamber 22 is formed above the processing chamber 21. Opposing electrodes 18, 19 are disposed in the plasma producing chamber 22. The opposing electrode 19 has a plurality of openings 20, and the electrode 19 separates the plasma producing chamber 22 from the processing chamber 21 so as to function as a partition plate. A raw gas cylinder 34 is connected to a gas introducing pipe 15.

The operation of the conventional apparatus will be described. When gas for etching is introduced into the plasma producing chamber 22 through the gas introducing pipe 15, the gas is supplied to the processing chamber 21 through the plasma producing chamber 22 and discharged by means of a vacuum pump. In this case, a pressure difference is produced between the plasma producing chamber 22 and the processing chamber 21 due to the conductance of the openings 20 formed between the plasma producing chamber 22 and the processing chamber 21. Under the conditions that the diameter of the openings is 0.1–0.8 mm, the number of the openings is 7, the effective discharge rate of discharge system is 1000 L/sec and the flow rate of gas is 50–100 cc/min, which are disclosed as specified numerical values in the above-mentioned publication, the pressure of the plasma producing chamber is maintained to be $1-5\times10^{-1}$ Torr and the pressure of the processing chamber is maintained to be $1\times10^{-3}$ Torr or lower. Then, when a high frequency electric power is supplied from a high frequency power source 17 to the opposing electrodes 18, 19, plasma is produced in the plasma producing chamber 22. The plasma passes through the openings 20 whereby a workpiece 2 placed on a table 26 disposed in the processing chamber 21 is etched.

In the plasma processing apparatus having the construction described above, the density of plasma produced in the plasma producing chamber 22 due to plane parallel electric discharge of high frequency electric power was at most in a range from $5\times10^8$ (pieces/cm$^3$) to $5\times10^9$ (pieces/cm$^3$). On the other hand, a speed for processing the workpiece 2 is in proportion to the density of plasma given to the workpiece. Accordingly, when an amount of the density of plasma produced is insufficient, plasma of high density could not be introduced to the processing chamber 21, and it was impossible to process the workpiece at a high speed. Further, since the pressure in the plasma producing chamber 22 in which the plane parallel electric discharge of high frequency power has to be maintained is about 0.1 Torr, there was a problem that the workpiece could not be processed under the condition of further high degree of vacuum.

In the conventional plasma processing apparatus having the construction that a single magnet is used as shown in FIG. 15, the magnetic flux density is uniformly increased from the center to the outer side, and accordingly, a uniform distribution of magnetic field can not be formed whereby there causes ununiformity of plasma density.

Further, in the case that a plurality of magnets are arranged in parallel to each other with their polarities being alternately changed as shown in FIG. 16, the direction of drifting of charged particles is different for each adjacent magnets. Specifically, a portion having a high density of plasma is produced in the direction of drifting whereby there causes ununiformity in plasma density. Accordingly, there was a problem that a workpiece having a large surface area could not be etched uniformly.

Further, in the plasma processing apparatus as shown in FIG. 18 wherein the plasma producing chamber is formed separately from the processing chamber, the density of plasma produced in the plasma producing chamber is low, and plasma of high density can not be introduced into the processing chamber, whereby the workpiece can not be processed at a high speed. Further, there was a problem that when the density of plasma was to be increased, it was impossible to process the workpiece under a high vacuum condition.

SUMMARY OF THE INVENTION

It is an object of the present invention to eliminate the above-mentioned problems of the conventional apparatuses and to provide a plasma processing apparatus capable of forming plasma uniformly throughout a large surface area and of processing uniformly a workpiece of large diameter.

It is a second object of the present invention to provide a plasma processing apparatus capable of increasing the density of plasma in the plasma producing chamber so that a workpiece can be processed at a high speed under a high vacuum condition.

Further, it is a third object of the present invention to provide a plasma processing apparatus capable of forming uniformly plasma of high density throughout a large surface area so that a workpiece having a large surface area can be processed uniformly at a high speed under a high vacuum condition.

In accordance with a first construction of the present invention, there is provided a plasma processing apparatus which comprises a first electrode on which a workpiece is placed, a second electrode located so as to face the first electrode, and a magnet disposed at the rear surface side of the second electrode which faces the first electrode, wherein the magnet is composed of a plurality of ring-shaped magnets each having the same polarity in their circumferential direction, and the ring-shaped magnets are concentrically arranged so that the polarities opposing in the radial direction of adjacent ring-shaped magnets are opposite to each other.

A second construction of the present invention is that in the first construction where the intensity of a magnetic field formed by the magnets near the second electrode is 100 Gausses or more in its maximum value and the intensity of a magnetic field formed by the magnets near the first electrode is 20 Gausses or less in its maximum value.

A third construction of the present invention is that in the second construction where a second magnet is disposed at the central portion of the ring-shaped magnets.

A fourth construction of the present invention is that of the third construction where the intensity of the magnetic field at the front surface of the second magnet disposed at the central portion of the ring-shaped magnets is greater than the intensity of the magnetic field of the ring-shaped magnets.

In accordance with a fifth construction of the present invention, there is provided a plasma processing apparatus which comprises a plasma producing chamber for producing plasma and a processing chamber in which a workpiece is placed and which is partitioned by a partition plate having a plurality of openings from the plasma producing chamber, wherein plasma is produced by supplying a high frequency electric power and by forming a magnetic field with use of a magnet.

A six construction of the present invention is that in the fifth construction, an electrode is disposed in the plasma producing chamber to face the partition plate so that a high frequency electric power is applied to the electrode. The magnet is composed of a plurality of ring-shaped magnets each having the same polarity in its circumferential direction, and the ring-shaped magnets are disposed concentrically at the rear side of the electrode so that the polarities opposing in the radial direction of adjacent ring-shaped magnets are opposite to each other.

A seventh construction of the present invention is that of the sixth construction where the electrode disposed to face the partition plate is applied with a first high frequency electric power, and the partition plate is applied with a second high frequency electric power.

An eighth construction of the present invention is that in the seventh construction where the partition plate is applied with a high frequency electric power; the magnet is composed of a plurality of ring-shaped magnets each having the same polarity in its circumferential direction, and the ring-shaped magnets are disposed concentrically in the plasma producing chamber at a position opposing the partition plate so that the polarities opposing in the radial direction of adjacent ring-shaped magnets are opposite to each other.

A ninth construction of the present invention is that in any of the fifth through the seventh constructions, gas is supplied to the plasma producing chamber in a manner of a series of pulses.

A tenth construction of the present invention is that in any of the fifth through the seventh constructions, the high frequency electric power is applied to a stage on which the workpiece is placed.

An eleventh construction of the present invention is that in any of the fifth through the seventh constructions, the high frequency electric power is applied to a stage on which the workpiece is placed.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1A:
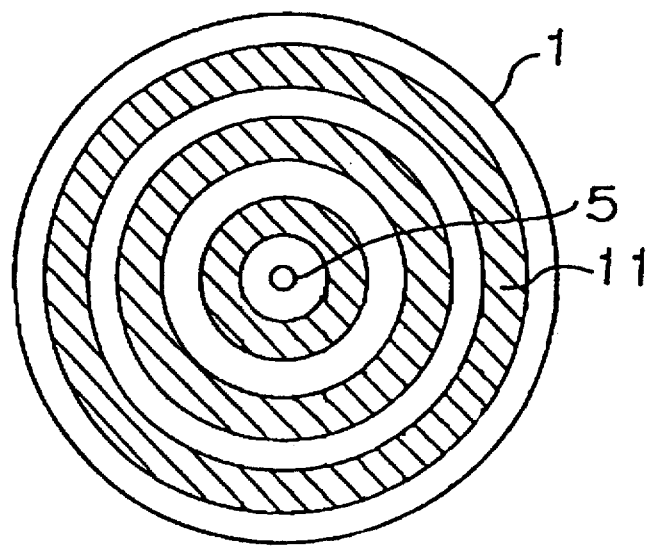
FIG. 1 is a schematic view in cross section of a plasma etching apparatus in accordance with a first embodiment of the present invention.

Preferred embodiments of the plasma processing apparatus of the present invention will be described by exemplifying an etching apparatus wherein the same reference numerals designate the same or corresponding parts.

EMBODIMENT 1

Figure 1B:
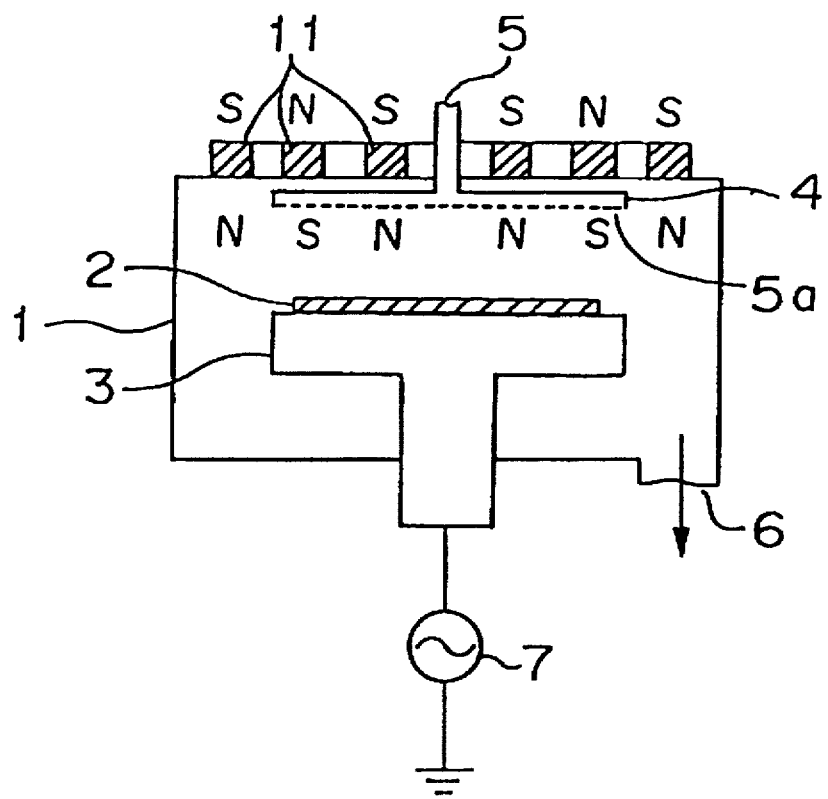

FIG. 1 is a schematic view in cross section of a plasma etching apparatus in accordance with the first embodiment of the present invention wherein an upper plane view is shown to make the feature of the present invention clear. A processing chamber 1 includes a first electrode 3 on which a workpiece to be etched 2 is placed and a second electrode 4. The second electrode 4 is provided with openings 5a for supplying gas introduced through an etching gas introducing port 5 to the space between the electrodes 3, 4. The processing chamber 1 is provided also with a gas discharge port 6. The second electrode 4 is connected to the processing chamber 1 to be kept at the earth potential. The first electrode 3 is electrically insulated from the processing chamber 1 and is connected with a high frequency power source 7. A plurality of ring-shaped permanent magnets 11 (three magnets in this case) are arranged concentrically at the side of atmosphere of the second electrode 4. The concentric center of the ring-shaped permanent magnets 11 corresponds to the center of the workpiece. Each of the permanent magnets 11 has the same polarity in the circumferential direction and a surface magnetic field intensity. The polarities of the magnets are determined in the vertical direction as shown in FIG. 1 and the polarities of adjacent permanent magnets are opposite to each other. The permanent magnets 11 used may be of a SmCo series or a Nd series. Further, the permanent magnets 11 may be coated with nickel plating or resin mold to prevent occurrence of cracks or corrosion. It is preferable that the magnets are placed under a cooling condition in order to avoid a change of the characteristics of the magnets due to heat by discharge.

In the etching apparatus constructed as described above, when gas for etching is introduced from the gas introducing port 5, the gas is passed through the gas openings 5a and is discharged to the outside by means of a discharge pump (not shown). During the introduction of the gas, a high frequency electric power generated from the high frequency power source 7 is applied to the first electrode 3, whereby plasma is produced across the first electrode 3 and the second electrode 4. Then, a loss of plasma can be reduced and plasma of high density can be maintained by the magnetic field formed by the three ring-shaped permanent magnets 11. The principle of producing the magnetic field is the same as that in the conventional apparatus.

Further, as described with reference to the conventional apparatus, the E×B drifting is produced due to an electric field and a magnetic field formed near the workpiece 2. However, an uneven distribution of plasma as seen in the conventional apparatus does not occur since the ring-shaped permanent magnets 11 are arranged concentrically wherein the polarities opposing in the radial direction of adjacent permanent magnets 11 are opposite to each other.

Specifically, since the ring-shaped permanent magnets 11 are arranged concentrically, a component of magnetic field in the circumferential direction, which corresponds to the diameter of the workpiece, in the magnetic field produced near the workpiece is eliminated, and a uniform magnetic field is formed with respect to the circumferential direction of the workpiece, whereby the plasma can be formed uniformly in the circumferential direction. Since the charged particles drift in the circumferential direction, the plasma density can be uniform in the same circumference. Further, the plasma is equalized by the diffusion of the plasma. Further, since the ring-shaped permanent magnets are so arranged that the polarities adjacent in the radial direction are opposite, the magnetic field in the radial direction has a distribution in a wavy form, and the plasma can be formed uniformly due to the diffusing effect of the plasma. Accordingly, the plasma can be formed uniformly throughout a large surface area which allows etching uniformly.

The magnetic field distributed in a wavy form in the radial direction can be controlled with respect to the height and the position of peaks in the wavy distribution of magnetic field by suitably determining the surface magnetic field intensity and an arrangement (distance) and so on of the ring-shaped permanent magnets 11. Namely, the difference in the magnetic field intensity in the radial direction can be controlled by suitably selecting magnets to be used and the arrangement and so on. By minimizing the difference of magnetic field intensity, the plasma can further be uniform, and it is possible to produce a uniform plasma of large diameter. By properly determining the arrangement of the magnets and so on, a wafer having a large diameter can be treated with a device of simple structure without using, for instance, a driving mechanism for driving the workpiece.

In the following, explanation will be made as to a case of forming by etching aluminum wirings in manufacturing a semiconductor by using the etching apparatus of this embodiment.

The workpiece 2 used was of a size of 6 inches. The surface magnetic field intensity of the ring-shaped permanent magnets 11 was 3000 Gausses. The distances between the adjacent ring-shaped permanent magnets were 50 mm. The distance between the ring-shaped permanent magnets 11 and the first electrode 4 was 40 mm. The distance between the first electrode 3 and the second electrode 4 was 80 mm. A gas mixture of $Cl_2/BCl_3$ was used as gas for etching and pressure in the processing chamber 1 was set to 50 m Torr for etching. In etching the aluminum wirings, an etching rate of 1000 nm/min and an index of uniformity of etching rate (a deviation or scattering in etching rate at a local portion to the total etching rate for the workpiece) of 5% were obtained.

When the above-mentioned construction is used together with the surface magnetic field intensity and the arrangement of the ring-shaped permanent magnets 11, a magnetic field intensity of 100 Gausses or more at the maximum value is formed near the second electrode 4 and a magnetic field intensity of 20 Gausses or less is formed near the first electrode 3. Accordingly, a loss of plasma can be reduced near the second electrode 4 because of a high magnetic field intensity, and plasma of high density can be maintained. In addition, a low magnetic field intensity is formed near the workpiece 2 whereby a product of less etching damage and high quality can be obtained.

Figure 2:
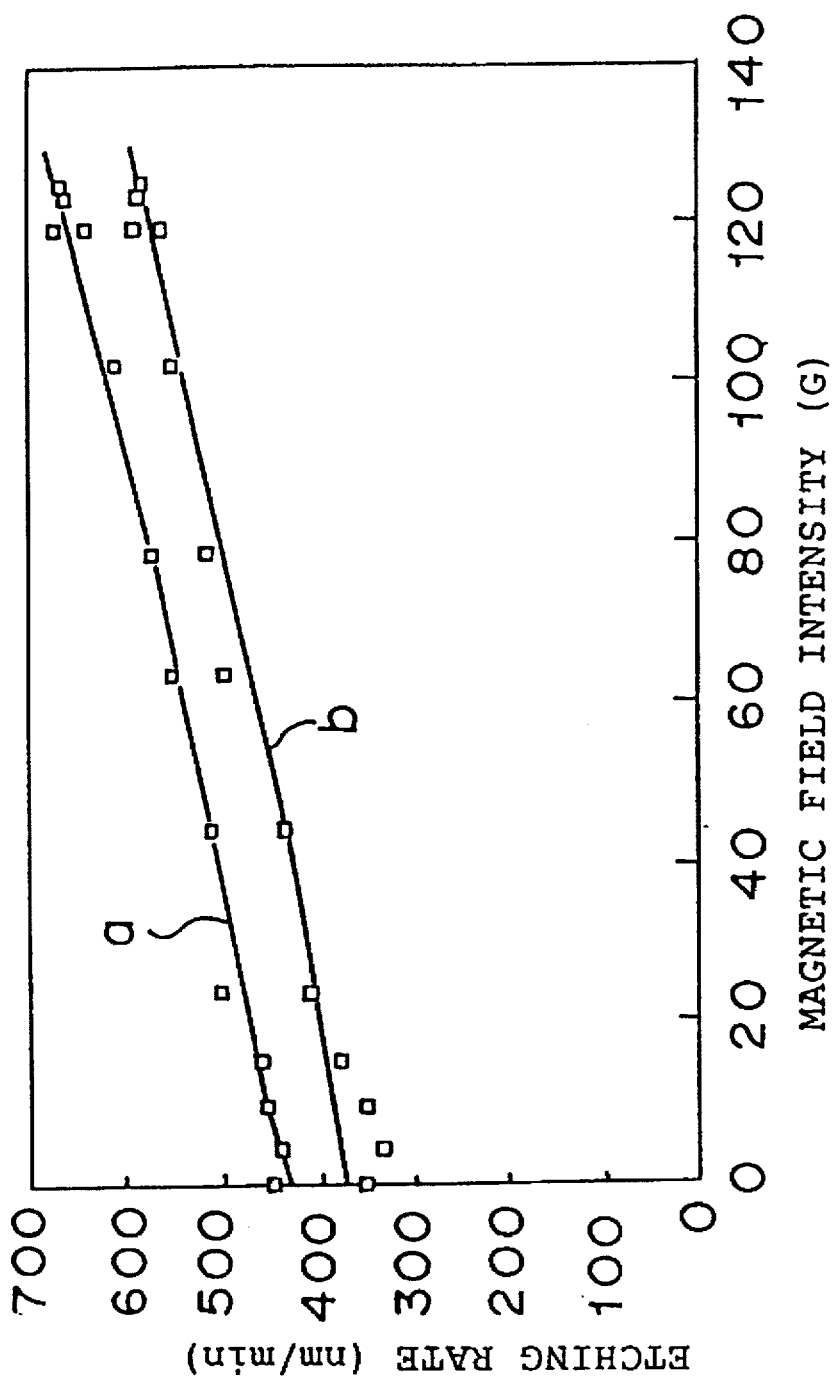
FIG. 2 is a characteristic diagram showing the relation between an etching rate of Al and a magnetic field of lateral direction in the apparatus according to the first embodiment.

As shown in the characteristic diagram of FIG. 2 showing the relation between the etching rate to the aluminum wirings and the magnetic field intensity in lateral direction B⊥, the etching rate can be expressed by a primary function of the magnetic field in lateral direction (a component parallel to the surface of the electrode) B⊥. It is considered as follows, when the magnetic field intensity in lateral direction is increased, the diffusion of plasma toward the electrode is suppressed, and the density of electrons is increased whereby an amount of ions incident to the workpiece (wafer) is increased. As described above, in order to increase the etching rate, it is necessary to increase B⊥. For instance, in order to obtain 500 nm/min which is practically used etching rate, it is considered that a magnetic field intensity B⊥ should be 100 G or more for etching aluminum wirings. In FIG. 2, the ordinate represents the etching rate (nm/min) to Al, and the abscissa represents the magnetic field intensity (G). A characteristic curve (a) indicates the B⊥ dependence of etching rate to Al in a case that the distance between the electrodes is 37 mm, and a characteristic curve (b) indicates the B⊥ dependence of etching rate to Al in a case that the distance between the electrodes is 57 mm. When a strong magnetic field is formed near the surface of the wafer, however, the charged particles such as electrons or ions undergo movement by the effect of the magnetic field whereby there occurs in a local area a charge-up phenomenon which may damage the wafer at the etching. In order to prevent the occurrence of such a damage by etching, a low magnetic field is formed near the first electrode 3 so that the magnetic field intensity is reduced to 20 Gausses or less which is considered to be less problem in practical operation. Thus, the workpiece can be processed to have a high quality. Further, a damage to a device formed on the workpiece can be prevented. It may be considered that formation of a uniform magnetic field at the workpiece (wafer) is difficult since the magnetic field is formed by permanent magnets, and an ununiform distribution of magnetic field is unavoidably formed. In this case, when the magnetic field intensity is large, the etching rate has an uneven pattern which is reflected by the uneven distribution of magnetic field. According to the present invention, however, such problem does not occur since a weak magnetic field of 20 G or less is formed.

Figure 3A:
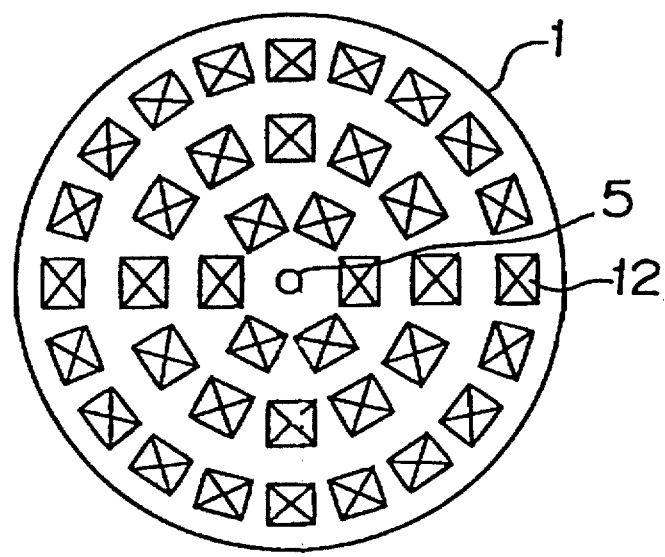
FIG. 3 is a schematic view in cross section of another plasma etching apparatus in accordance with the first embodiment of the present invention.
Figure 3B:
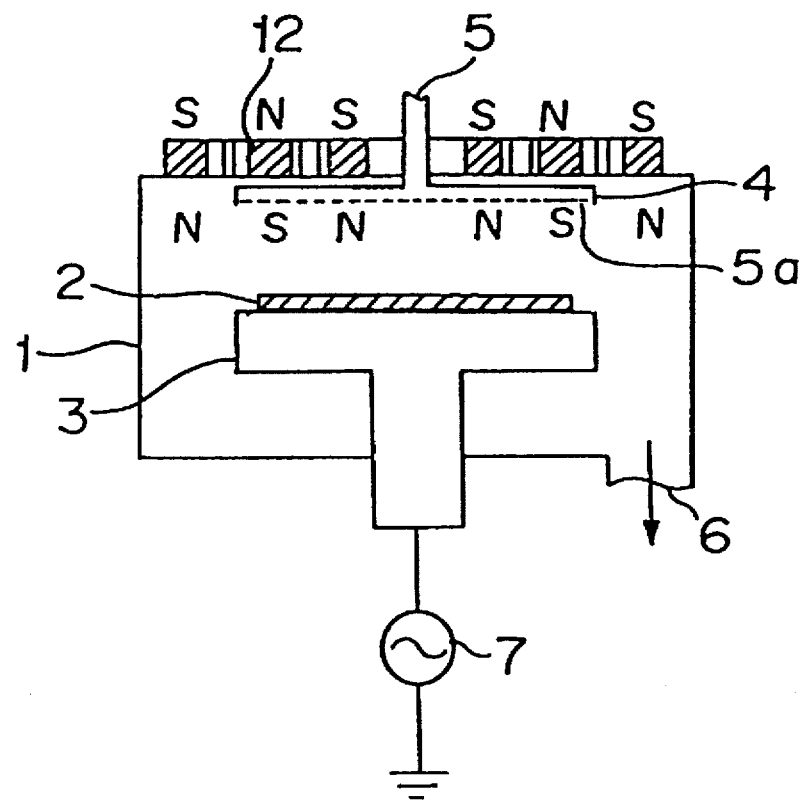

FIG. 3 is a schematic view in cross section and an upper plane view of a plasma etching apparatus as a modified embodiment of the first embodiment of the present invention. In FIG. 3, numeral 12 designates permanent magnets each having a rectangular prism form which are used instead of the ring-shaped permanent magnets 11 used in the first embodiment. A plurality of the rectangular prism-like permanent magnets are arranged in a form of plural concentric circles at the side of atmosphere of the second electrode. According to such modified embodiment, it is unnecessary to prepare permanent magnets so as to match the size of an etching apparatus, and it is sufficient to arrange a plurality of permanent magnets, which may be rectangular prism form or a cylindrical form, which can be standardized and therefore inexpensive. A change of the arrangement of the permanent magnets can be easy when a change of design (specification) is required.

In the etching apparatus of the modified embodiment, since the rectangular prism-like permanent magnets 12 are arranged in a form of plural concentric circles, there is no substantial component of magnetic field in the circumferential direction, which corresponds to the diameter of the workpiece, among the entire components of magnetic field formed near the workpiece. Accordingly, in the same manner as described in the first embodiment, a uniform plasma with little uneven distribution is formed, and substantially the same effect of etching as in the first embodiment can be obtained. In this embodiment, it is not always to determine the polarities of the permanent magnets to be in the vertical direction as shown in FIGS. 1 and 3 but may be in the lateral direction.

EMBODIMENT 2

Figure 4A:
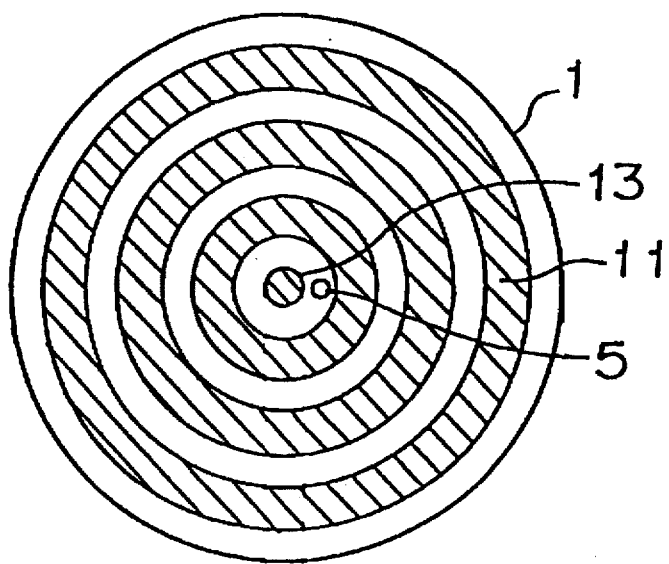
FIG. 4 is a schematic view in cross section of a plasma etching apparatus in accordance with a second embodiment of the present invention.
Figure 4B:
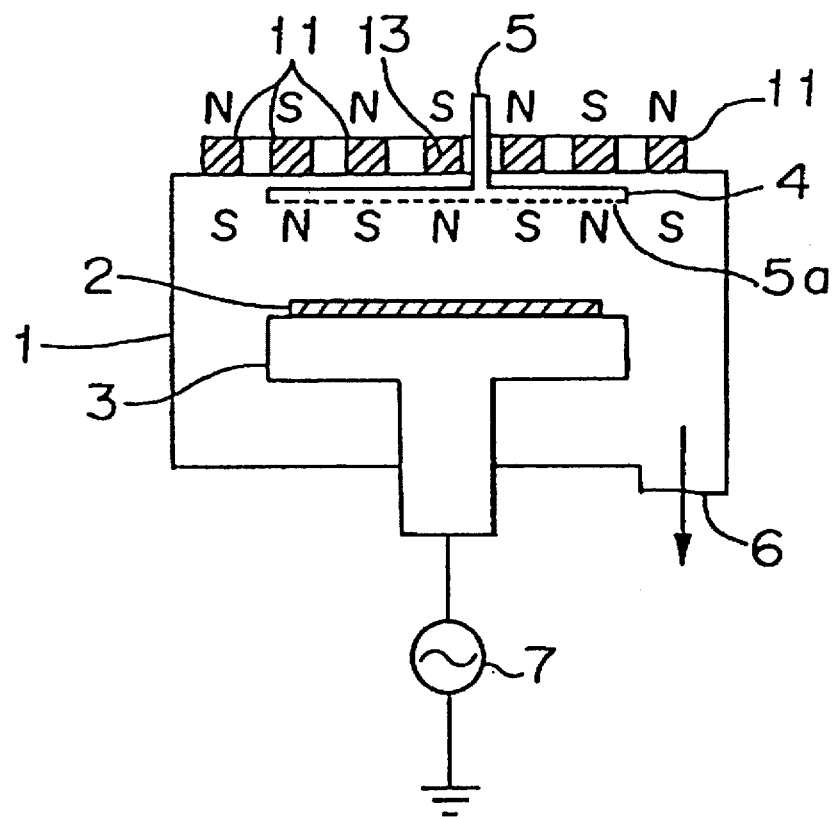

FIG. 4 is a schematic view in cross section and an upper plane view of a plasma etching apparatus according to the second embodiment of the present invention. In the same manner as in Example 1, a plurality of (three in FIG. 4) ring-shaped permanent magnets 11 are concentrically arranged at the side of atmosphere of the second electrode 4. The concentric center of the permanent magnets 11 corresponds to the center of the workpiece, and each of the permanent magnets 11 has the same polarity in the circumferential direction and the same surface magnetic field intensity. The polarities of the magnets are formed in the vertical direction, and the polarities opposing in the radial direction of adjacent permanent magnets are opposite to each other. Further, a cylindrical permanent magnet 13 is disposed at the concentric center of the ring-shaped permanent magnets 11. Accordingly, the gas introducing port 5 is formed deviated from the concentric center.

In the etching apparatus having the construction described above, etching is conducted in the same manner as that described in the first embodiment. In the second embodiment, however, the magnetic field intensity in the radial direction can be further uniform because the cylindrical permanent magnet 13 is disposed at the concentric center of the ring-shaped permanent magnets 11 whereby the magnetic field intensity (a component of the magnetic field in parallel to the electrodes) in near the center is increased.

Figure 5:
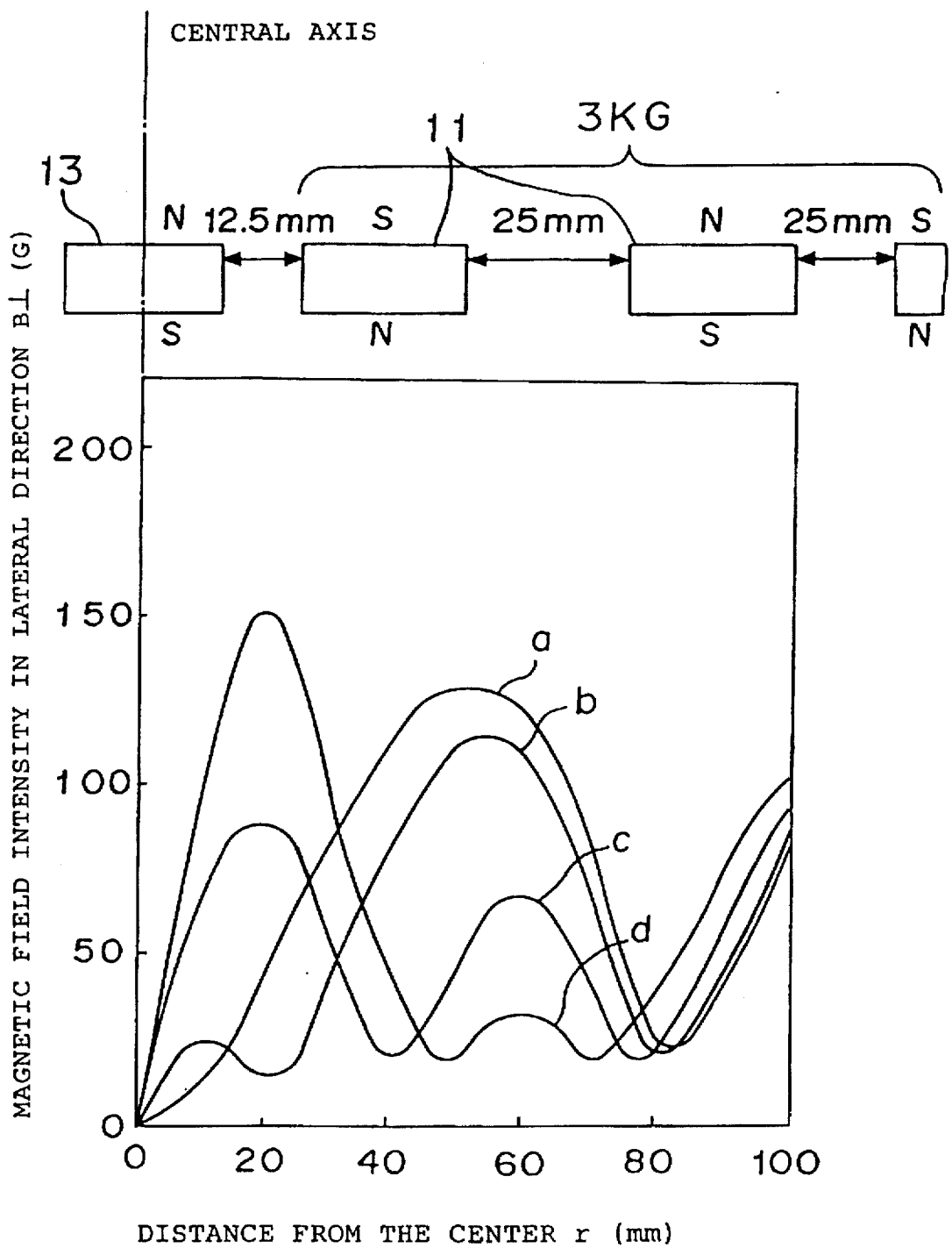
FIG. 5 is a diagram showing the relation of the intensities of magnetic field distributed in the radial direction in the etching apparatuses in accordance with the first embodiment and the second embodiment of the present invention.

FIG. 5 is a diagram showing the distribution of magnetic field intensity in the radial direction near the surface of the second electrode 4 in the etching apparatus of the second embodiment wherein the distribution of the magnetic field intensity is shown in correspondence to the arrangement of the magnets. Measurement was conducted under the condition that the ring-shaped permanent magnets 11 each having a surface magnetic field intensity of 3000 Gausses are arranged as shown in the FIG. 5. In FIG. 5, the ordinate represents the magnetic field intensity in lateral direction $B\perp$ (G) at the surface of the second electrode, and the abscissa represents the distance from the center r (mm). A characteristic curve (a) indicates a distribution of magnetic field in a case that no permanent magnet 13 is disposed at the center which corresponds to the case of the first embodiment, and a characteristic curve (b) indicates a distribution of magnetic field in a case that the cylindrical permanent magnet 13 having a surface magnetic field intensity of 3000 Gausses, which is the same as that of each of the ring-shaped permanent magnets 11, is placed at the center. As seen in FIG. 5, the magnetic field intensity is increased around the center so that the distribution is made uniform whereby a uniform plasma is produced throughout a large surface area and etching can be conducted uniformly.

A characteristic curve (c) represents a distribution of magnetic field intensity in a case that the surface magnetic field intensity of the permanent magnet 13 located at the center is 5000 Gausses which is greater than the surface magnetic field intensity of the ring-shaped permanent magnets 11, and a characteristic curve (d) indicates a distribution of magnetic field intensity in a case that the surface magnetic field intensity of the permanent magnet 13 located at the center is 7500 Gausses. When the surface magnetic field intensity of the permanent magnet 13 is greater than the surface magnetic field intensity of the ring-shaped permanent magnets 11, the magnetic field intensity around the center is further increased in comparison with the distribution of magnetic field in the case that both the permanent magnets 11, 13 have the same surface magnetic field intensity, whereby a magnetic field is uniformly formed in the radial direction. As a result, a further uniform plasma is produced to allow uniform etching.

In case that the ring-shaped (concentrical) magnets 11 are 40–50 mm apart from the central magnet 13 and the distance between the surfaces of the magnets 11, 13 and the surface of the second electrode 4 is 30–50 mm, and when the magnetic flux density at the surface of the second electrode 4 is determined to be about 100–150 G, the surface magnetic flux density of the magnets should be 2–3 kG. In the above-mentioned arrangement, when it is desired to form a peak of 100–150 G or more at a position near the center of the surface of the second electrode 4, the surface magnetic flux density of the central magnet 13 should be about 4–5 kG. At present, the maximum value of the surface magnetic flux density of a permanent magnet easily available is about 5–6 kG.

Table 1 shows the relation of the arrangement of magnets (the surface magnetic field intensity of the permanent magnets and distances from the center) and the etching characteristics of the second embodiment.

TABLE 1

| Arrangement of magnets | | | | Etching rate to Al (A/min) | Uniformity (%) |
|---|---|---|---|---|---|
| Central magnet | Ring-shaped permanent magnets | | | | |
| — | 1 kG 25 mm | 1 kG 75 mm | 1 kG 125 mm | 4423 | 50.6 |
| — | 3 kG 25 mm | 3 kG 100 mm | 5522 | 39.4 | |
| 5 kG | 3 kG 57.5 mm | 6331 | 12.9 | | |

EMBODIMENT 3

Figure 6A:
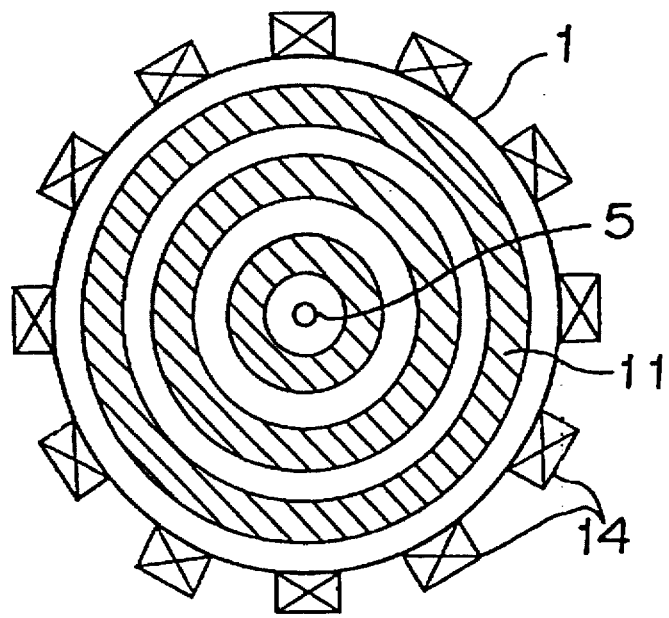
FIG. 6 is a schematic view of a plasma etching apparatus in accordance with a third embodiment of the present invention.
Figure 6B:
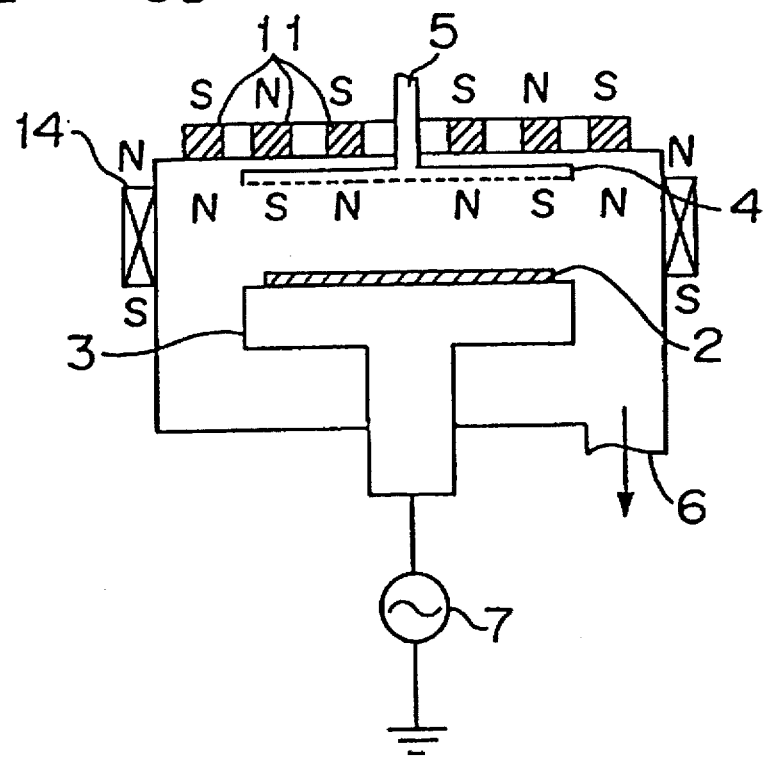

FIG. 6 is a schematic view in cross section and an upper plane view of a plasma etching apparatus according to the third embodiment of the present invention wherein numeral 11 designate the ring-shaped permanent magnets as used in the first embodiment and numeral 14 designate bar-like permanent magnets disposed on the circumferential wall of the processing chamber 1 at the position corresponding to the space between the first and second electrodes. The bar-like permanent magnets are circumferential wall magnets, and the number of the magnets disposed around the circumferential wall is 12.

In the etching apparatus having the construction described above, etching is conducted in the same manner as in the first embodiment. In the third embodiment, however, when plasma is produced across the electrodes, a loss of plasma in the direction of the circumferential wall can be reduced due to a magnetic field formed by the circumferential wall magnets 14 arranged around the circumferential wall of the processing chamber 1. Accordingly, plasma of high density is produced uniformly in the substantial portion between the electrodes whereby etching is conducted uniformly. In the third embodiment, the polarities of the circumferential wall magnets 14 are determined to be in the vertical direction, and the polarities of the bar-like circumferential wall magnets 14 adjacent to the outermost ring-shaped permanent magnet 11 is the same as the polarity of the outermost ring-shaped permanent magnet 11. With such arrangement, uniformity in plasma density is further increased to allow the etching uniformly.

Figure 7A:
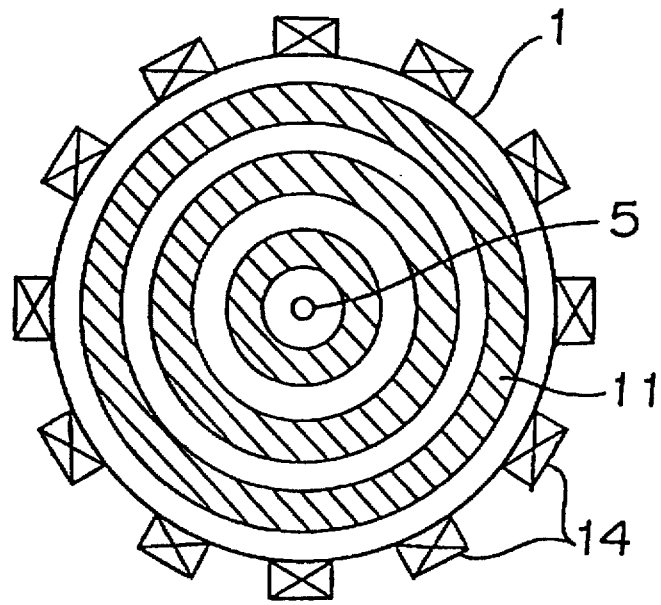
FIG. 7 is a schematic view in cross section of another plasma etching apparatus in accordance with the third embodiment of the present invention.
Figure 7B:
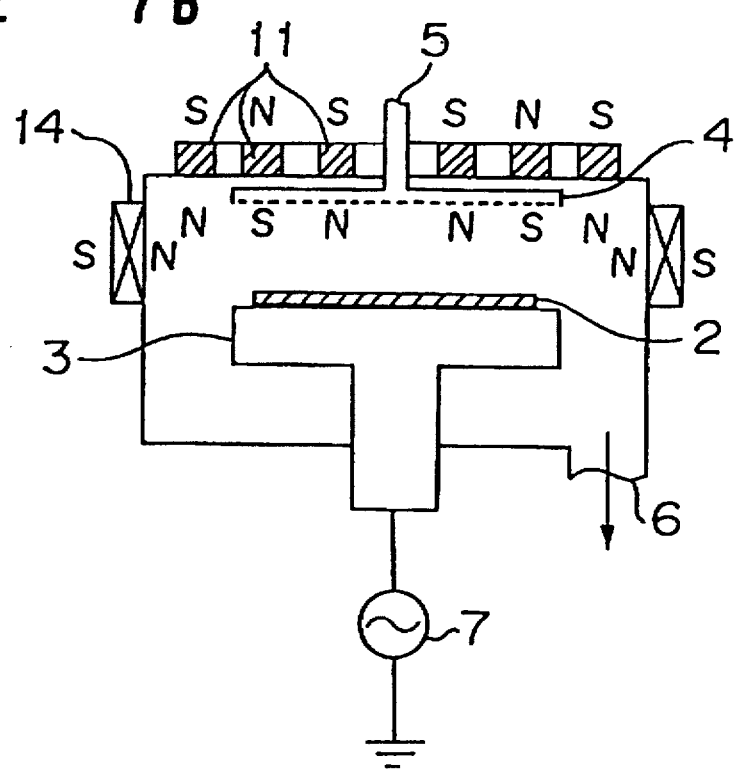

The polarities of the bar-like circumferential wall magnets 14 may be determined in the lateral direction as shown in FIG. 7. Even in this case, a loss of plasma in the circumferential wall direction can be reduced whereby plasma of high density is formed uniformly to allow the etching uniformly.

Figure 8:
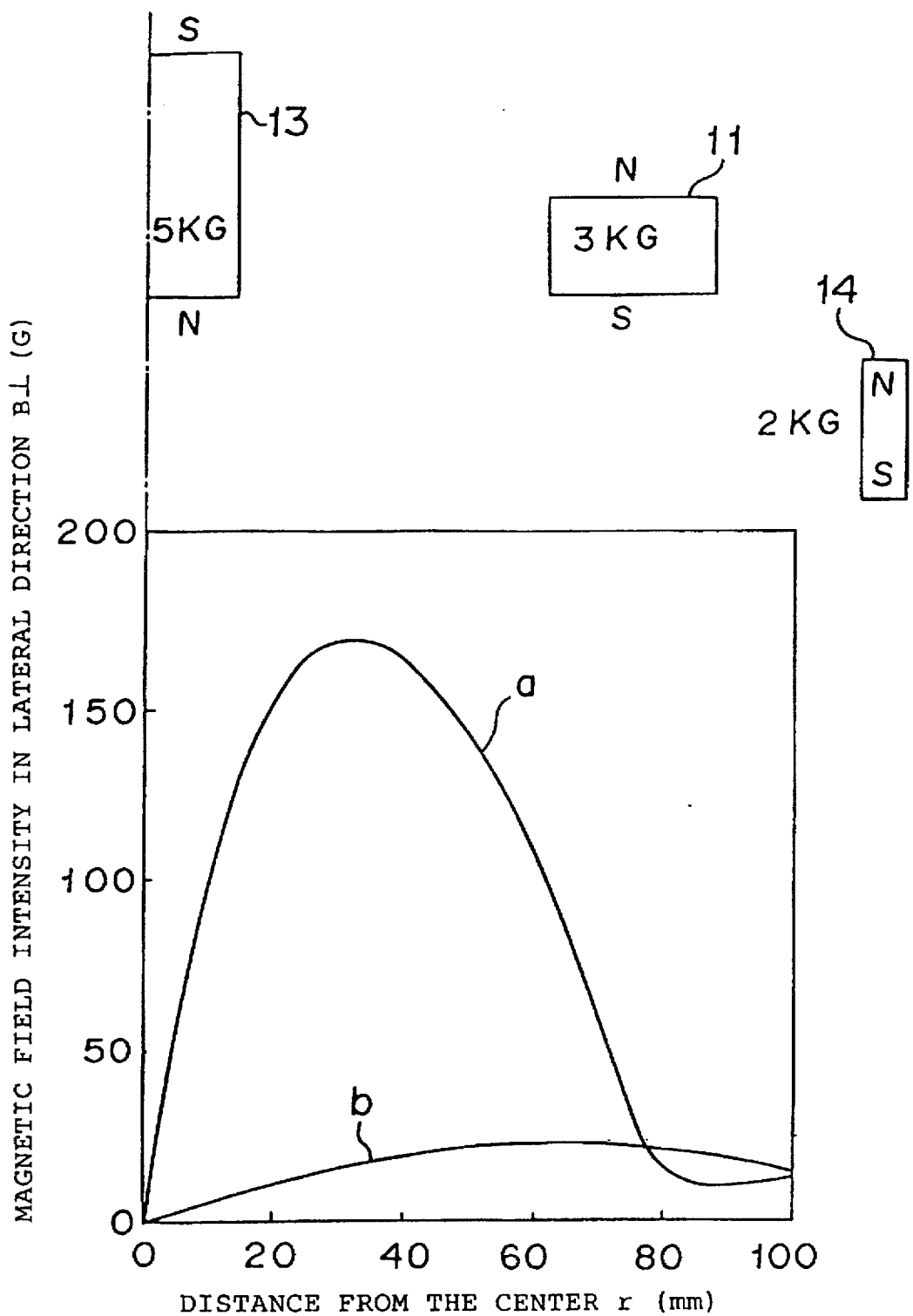
FIG. 8 is a diagram showing the relation of the intensities of magnetic field distributed in the radial direction and an arrangement of magnets an the etching apparatus of the present invention.

FIG. 8 is a diagram showing the relation between a positional arrangement of the central permanent magnet 13, the ring-shaped permanent magnets 11 and the circumferential wall magnets 14 in an etching apparatus embodiment and distributions of magnetic field intensity in the radial direction, wherein the ordinate represents the magnetic field intensity in lateral direction B⊥ (G) and the abscissa represents distance from the center r (mm). A characteristic curve (a) indicates a magnetic field distribution at the surface of the second electrode and a characteristic curve (b) indicates a magnetic field distribution at the surface of the first electrode.

EMBODIMENT 4

Figure 9A:
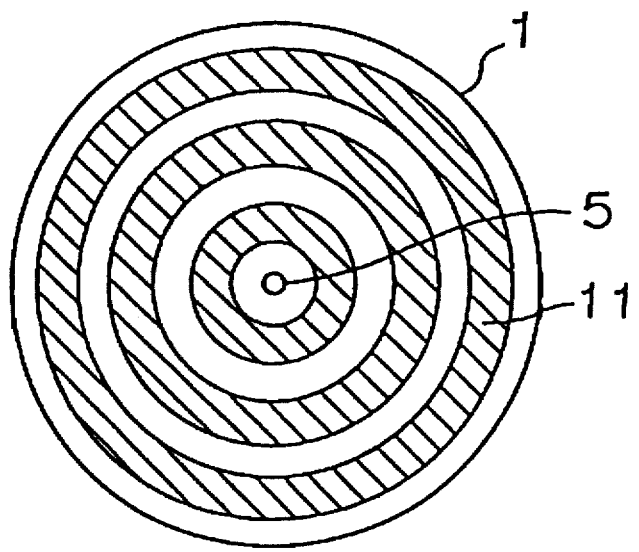
FIG. 9 is a schematic view in cross section of a plasma etching apparatus in accordance with a fourth embodiment of the present invention.
Figure 9B:
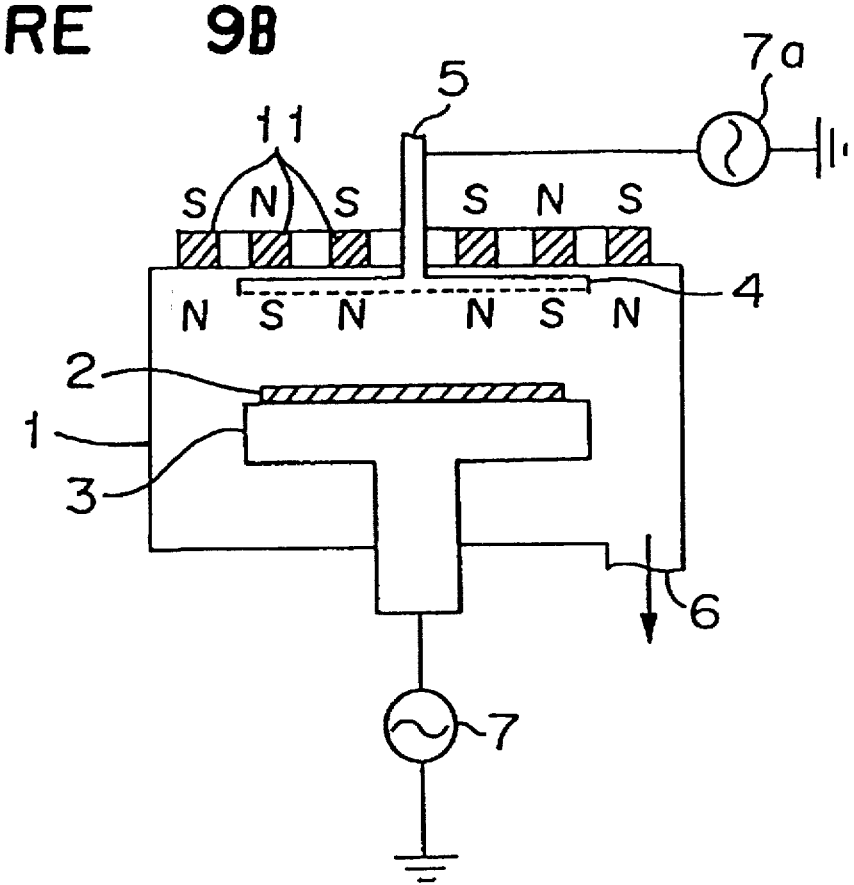

FIG. 9 is a schematic view in cross section and an upper plane view of a plasma etching apparatus in accordance with the fourth embodiment of the present invention wherein numeral 7a designates a second high frequency power source connected to the second electrode 4, which is the same as the first high frequency power source connected to the first electrode in the first embodiment. The second electrode 4 is electrically insulated from the processing chamber 1.

In the etching apparatus having the construction described above, etching is conducted in the same manner as the first embodiment. When a high frequency electric power is supplied to the second electrode 4, ionization is accelerated by the E×B drifting of charged particles due to an electric field and a magnetic field formed near the second electrode 4. As a result, plasma of high density is produced, and processing rate to the workpiece is increased.

A modified embodiment of the fourth embodiment will be described. In the modified embodiment, the frequency of a high frequency power generated from the second high frequency power source 7a connected to the second electrode 4 is determined to be, for instance, 13.56 MHz, and the frequency of a high frequency power generated from the first high frequency power source 7 connected to the first electrode 3 is made changeable and is determined to be, for instance, in a range from 400 kHz to 2 MHz. Thus, the first electrode 3 and the second electrode 4 are applied with different frequencies of high frequency power.

The etching apparatus of the modified embodiment, etching is conducted in the same manner as in the first embodiment. In this case, however, plasma produced across the electrodes is as follows. Since a high frequency power of 13.56 MHz is supplied to the second electrode 4, ionization is accelerated by the E×B drifting of charged particles due to an electric field and a magnetic field formed around the second electrode 4, whereby plasma of high density is produced. On the other hand, since the first high frequency power source 7 in which frequency is changeable is connected to the first electrode 3, the frequency of electric power can be changed depending on the material, the shape and so on of the workpiece so that the characteristics of plasma suitable for etching can be obtained. For instance, ion energy applied to the workpiece, which is one of the major factors to determine etching characteristic, can be controlled by changing the frequency. As a result, a high speed etching is possible under sufficient control.

Further, by making the frequency of the second high frequency power source 7a changeable, the density and the temperature of electrons can be controlled in a wide range in addition to the control of the ion energy.

EMBODIMENT 5

Figure 10:
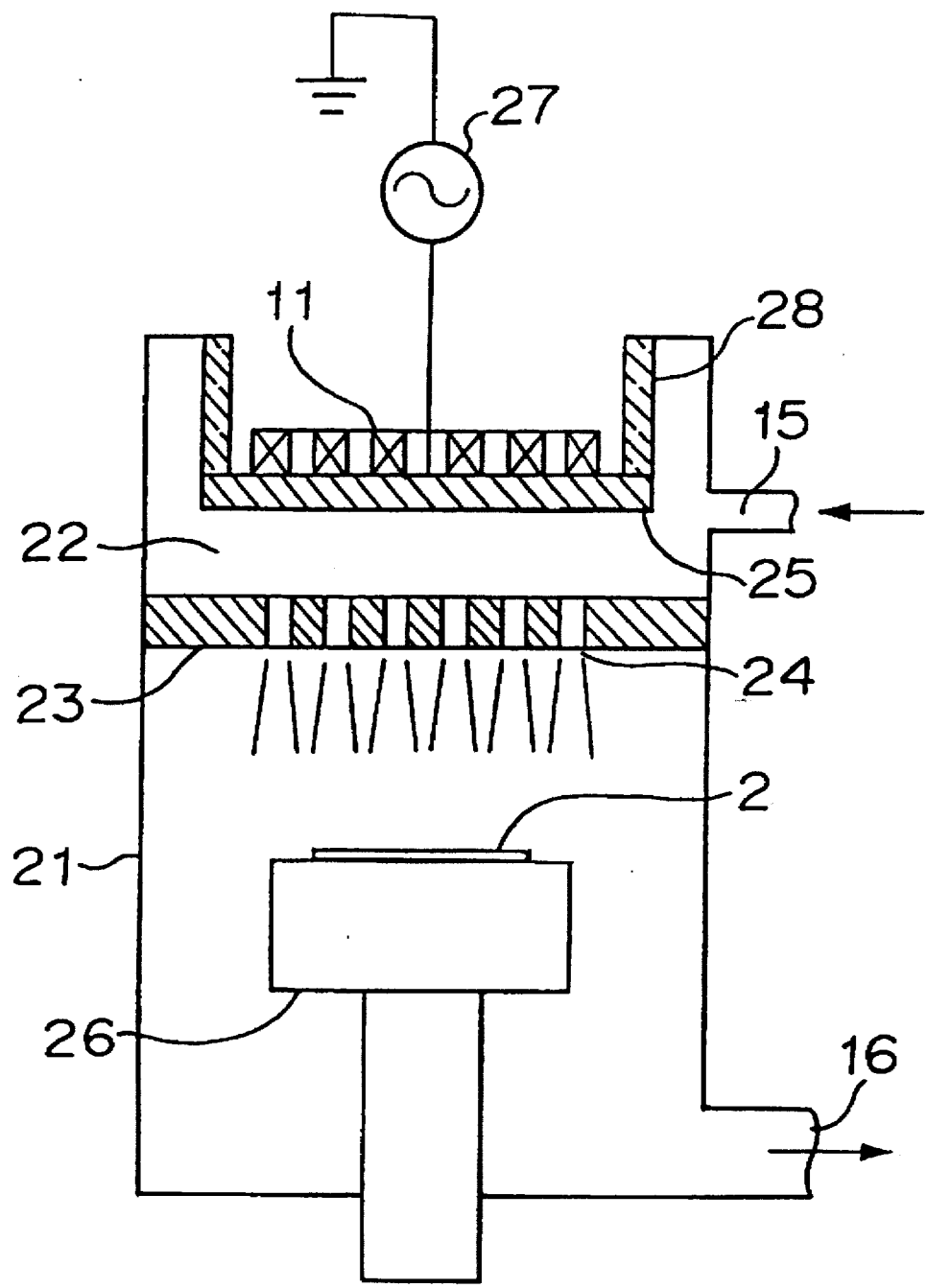
FIG. 10 is a schematic view in cross section of a plasma etching apparatus in accordance with a fifth embodiment of the present invention.

FIG. 10 is a schematic view in cross section of a plasma dry etching apparatus in accordance with the fifth embodiment of the present invention. Reference numeral 21 designates a processing chamber in which a workpiece 2 is placed on a stage 26. Numeral 22 designates a plasma producing chamber. Gas for etching is supplied to the plasma producing chamber 22 through a gas introducing pipe 15. Numeral 23 designates a partition plate having a plurality of openings 24, which is provided between the plasma producing chamber 22 and the processing chamber 21. Air in the processing chamber 21 is evacuated through a discharge port 16 by means of a vacuum pump (not shown). The processing chamber 21 is kept at a higher degree of vacuum than the plasma producing chamber 22. An electrode 25 is disposed in the plasma producing chamber 22 at a position opposing the partition plate 23, and the electrode is supplied with a high frequency electric power from a high frequency power source 27. A plurality of ring-shaped permanent magnets are disposed at the side of atmosphere of the electrode 25. Numeral 28 designates a supporting member for insulating the electrode 25 from the wall of the plasma producing chamber 22 with respect to a high frequency electric power, and the supporting member is sealed in a vacuum state from the plasma producing chamber 22 and the electrode 25.

In the dry etching apparatus having the construction described above, gas for etching introduced into the plasma producing chamber 22 is discharged from the discharge port 5 through the processing chamber 21 via the openings 25 formed in the partition plate 23. During the introduction and discharge of the gas for etching, when a high frequency electric power is applied to the electrode 25 in the plasma producing chamber 22, ionization is accelerated by E×B drifting due to an electric field and a magnetic field produced by the permanent magnets 11 disposed near the electrode 25, whereby plasma of high density is produced. The plasma producing in the plasma producing chamber 22 is transported to the processing chamber 21 through the openings 24 of the partition plate 23 whereby the workpiece 2 placed on the stage 26 is etched.

In the following, description will be made as to a construction of the etching apparatus suitable for etching a workpiece having a large diameter by exemplifying numerical values for the etching.

In the same manner as in FIG. 1 concerning the first embodiment of the present invention, three ring-shaped permanent magnets 11 are concentrically arranged at the side of atmosphere of the electrode 25 in the plasma producing chamber 22. With such arrangement, the E×B drifting is produced near the electrode 25 due to an electric field and a magnetic field produced near the electrode 25, however, an uneven distribution of plasma is not produced. It is because there is produced no component of magnetic field in the circumferential direction of the electrode 25 in the magnetic field formed near the electrode 25 owing to the concentric arrangement of the ring-shaped permanent magnets. Accordingly, plasma can be produced uniformly throughout a large surface area.

In the apparatus, the surface magnetic field intensity of the ring-shaped permanent magnets 11 is 3000 Gausses. The distances between the adjacent ring-shaped permanent magnets are 50 mm. The distance between the ring-shaped permanent magnets 11 and the electrode 25 is 40 mm. The distance between the electrode 25 and the partition plate 23 is 80 mm. The volume of the plasma producing chamber 22 is 10 liters. The volume of the processing chamber 21 is 50 liters. The effective discharge rate for vacuum is 1000 l/sec. The total surface area of the openings 24 of the partition plate 23 is about 7.0 cm$^2$. Cl$_2$ gas is used as gas for etching. When the pressure of the plasma producing chamber is set to 5 m Torr, the pressure of the processing chamber 21 becomes about 1 m Torr. When electric discharge is conducted under the above-mentioned conditions, the density of plasma produced in the plasma producing chamber 22 is in a range from about $5 \times 10^9$ (pieces/cm$^3$) to about $5 \times 10^{10}$ (pieces/cm$^3$), which is one order higher than that in a case that no magnetic field is formed. Further, the processing chamber 21 is kept to be a high degree of vacuum, and accordingly, a fine pattern can be produced.

In etching a polysilicon material for a gate circuit in manufacturing a semiconductor device by using the etching apparatus having the construction as described above, a workpiece 2 having a diameter of 6 inches could be processed at an etching rate of 100 nm/min and a uniformity of 5%.

In the same manner as shown in FIG. 4 concerning the second embodiment of the present invention, when a cylindrical permanent magnet 13 is disposed at the concentric center of the ring-shaped permanent magnets 11, the uniformity of the etching rate can further be improved. In this case, the uniformity of the magnetic field can be controlled by determining the surface magnetic intensity of the cylindrical permanent magnet to be higher than or lower than 3000 Gausses of the surface magnetic field intensity of the ring-shaped permanent magnets. As a result, the plasma is produced uniformly in the plasma producing chamber whereby etching can be conducted uniformly.

Further, when the apparatus having the arrangement as described above and the surface magnetic field intensity of the ring-shaped permanent magnets 11 are used, a magnetic field intensity of 100 Gausses or more is formed in the plasma producing chamber 22 and a magnetic field intensity of 20 Gausses or less is formed near the stage 26 in the processing chamber 21. As a result, the formation of the plasma is accelerated in a high magnetic field near the electrode 25 in the plasma producing chamber 22, and the plasma of high density can be maintained. In addition, since a low magnetic field is formed near the workpiece 2, a product of less etching damage and high quality can be obtained at a high speed.

EMBODIMENT 6

Figure 11:
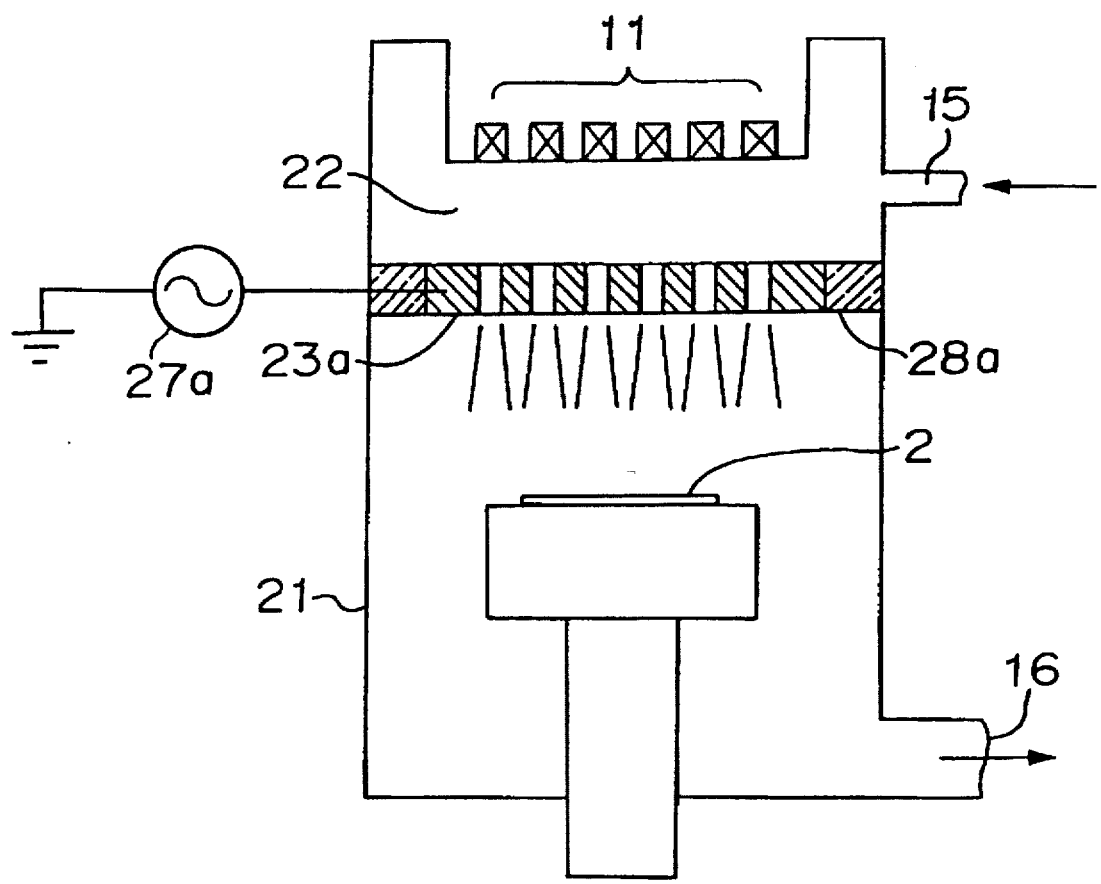
FIG. 11 is a schematic view in cross section of a plasma etching apparatus in accordance with a sixth embodiment of the present invention.

FIG. 11 is a schematic view in cross section of a plasma etching apparatus in accordance with the sixth embodiment of the present invention. Reference numeral 23a designates a partition plate provided in the plasma producing chamber 22, which is fixed to a supporting member 28a having an insulating property to a high frequency power. The partition plate 23a is applied with a high frequency power from a second high frequency power source 27a. The ring-shaped magnets 11 are arranged so as to oppose the partition plate 23 in the plasma producing chamber 22.

Etching is conducted in the same manner as described with respect to the fifth embodiment. In the plasma producing chamber 22, plasma is produced around the partition plate 23a due to the high frequency power applied to the partition plate 23a. High frequency discharging appears at the side of the plasma producing chamber 22 and at the side of the processing chamber 21 with respect to the partition plate 23a. In this case, since the pressure in the plasma producing chamber 22 is larger than that in the processing chamber 21, the electric discharge at the side of the processing chamber 21 is small. Further, the magnets 11 disposed to oppose the partition plate 23a in the plasma producing chamber 22 controls the diffusion of the plasma to the wall of the plasma producing chamber 22. As a result, a substantial portion of the plasma produced near the partition plate 23 is quickly transported without deterioration from the partition plate 23a to the processing chamber 21. Accordingly, the workpiece 2 can be quickly etched by the plasma of high density.

EMBODIMENT 7

Figure 12:
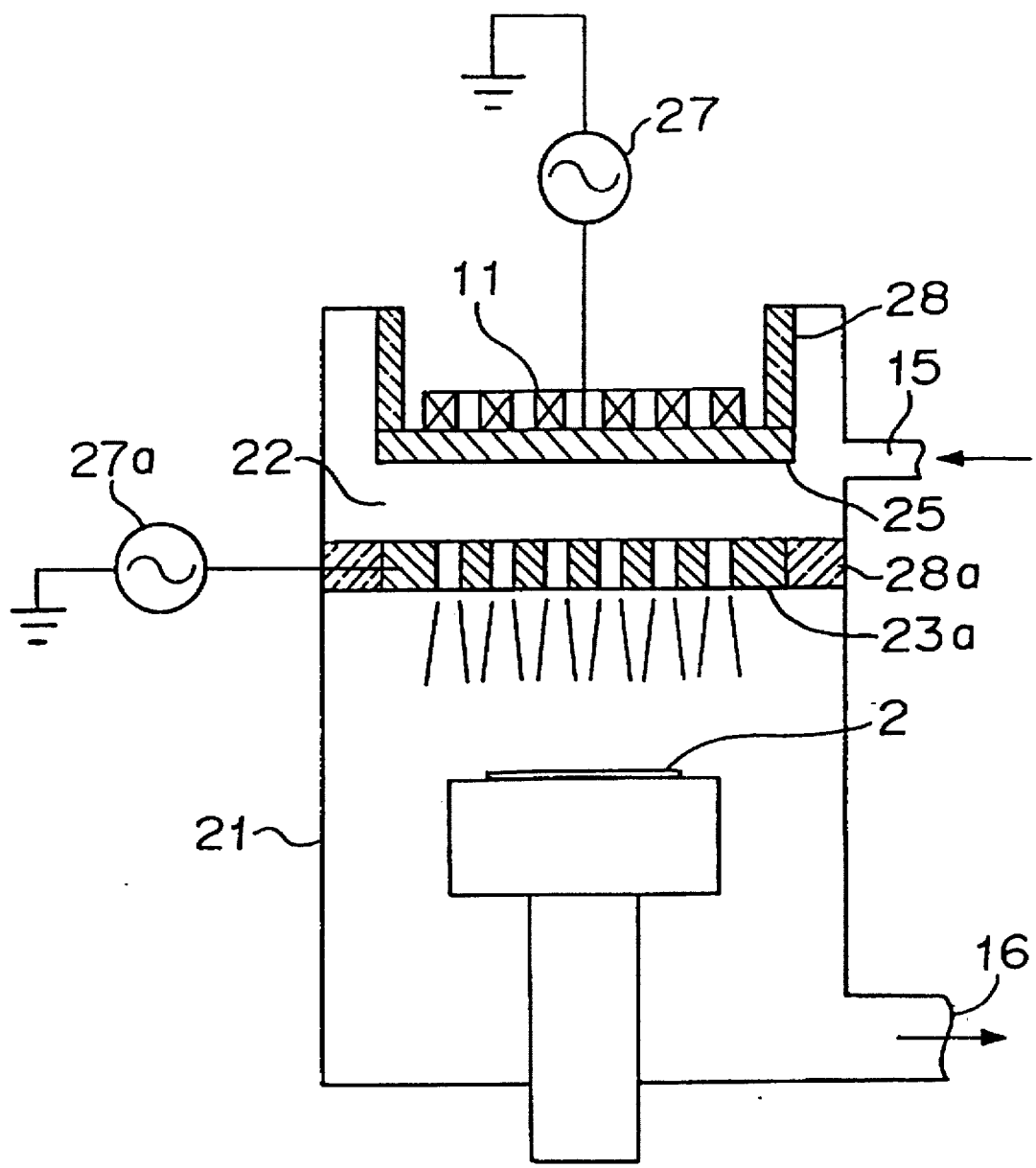
FIG. 12 is a schematic view in cross section of a plasma etching apparatus in accordance with a seventh embodiment of the present invention.

FIG. 12 is a schematic view in cross section of a plasma etching apparatus in accordance with the seventh embodiment of the present invention which is a modification of the sixth invention. Accordingly, the same reference numerals designate the same or corresponding parts. The partition plate 23a disposed in the plasma producing chamber 22 is fixed to the supporting member 28a having an insulating property to a high frequency power. A high frequency power is supplied to the partition plate 23a from the second high frequency power source 27a. Further, a high frequency power is supplied to the electrode 25 from the first high frequency power source 27 wherein the electrode 25 is disposed to oppose the partition plate 23 of the plasma producing chamber 22 and fixed to the supporting member 28 which is insulated with respect to the high frequency power. The ring-shaped magnets 11 are arranged at the side of atmosphere of the electrode 25. In the etching apparatus having the construction as described above, etching is conducted in the same manner as described with respect to the fifth embodiment. When plasma is produced in the plasma producing chamber 22, ionization is accelerated by E×B drifting due to an electric field formed by the first high frequency power source 27 and the magnets 21 in the vicinity of the electrode 25 whereby plasma of high density is produced. In addition, plasma is produced near the partition plate 23a to which the second high frequency is applied. As a result, the plasma of high density is produced in comparison with the fifth embodiment, and the workpiece 2 can be etched at a high speed.

EMBODIMENT 8

Figure 13:
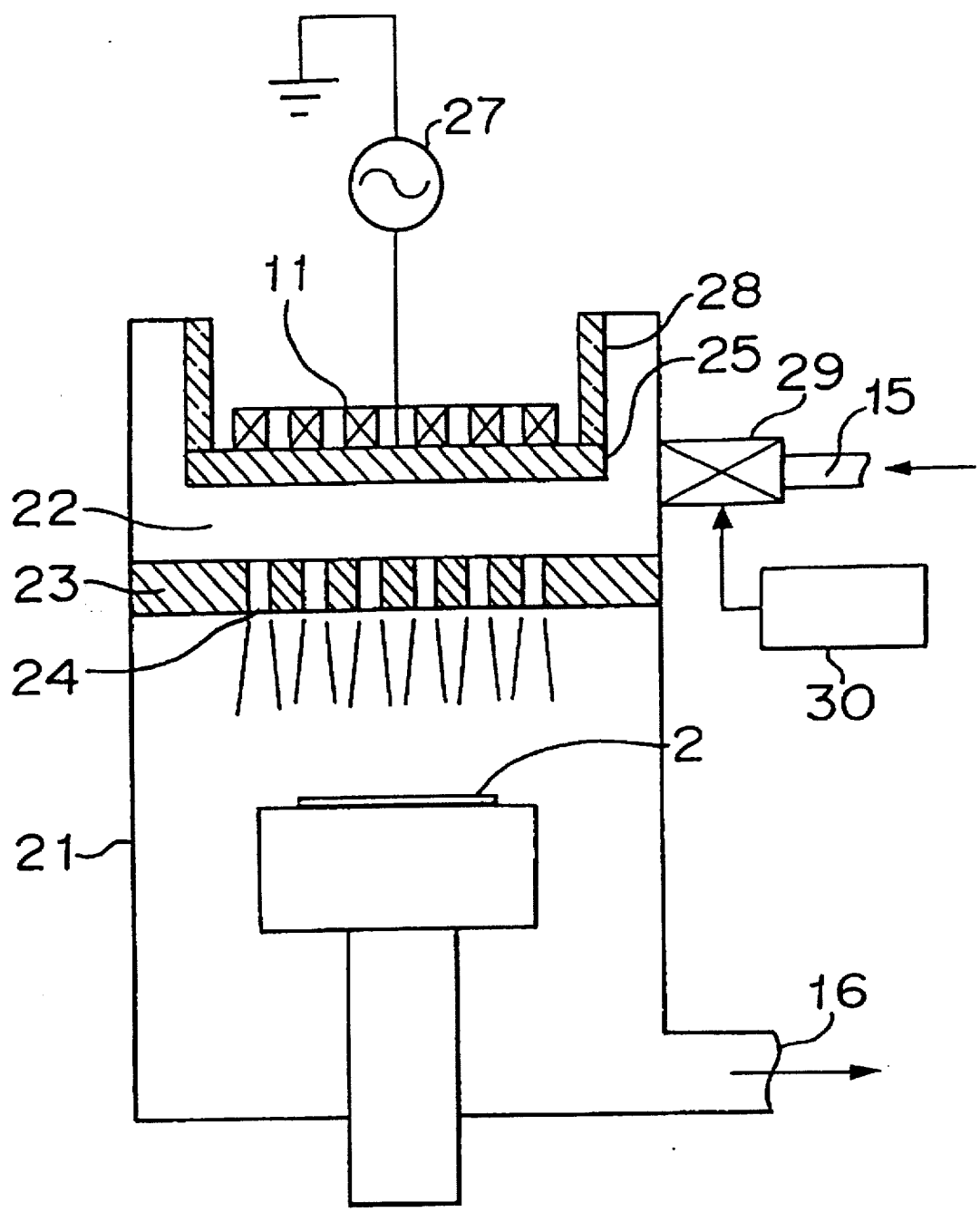
FIG. 13 is a schematic view in cross section of a plasma etching apparatus in accordance with an eighth embodiment of the present invention.

FIG. 13 is a schematic view in cross section of a plasma etching apparatus in accordance with the eighth embodiment of the present invention. Gas for etching is supplied from the gas introducing pipe 15 through a pulse gas valve 29 which is a pulse gas supplying means actuated by an actuating device 30, to the plasma producing chamber 22.

In the etching apparatus having the construction as described above, etching is conducted in the same manner as described with respect to the fifth embodiment. In this case, the pulse gas valve 29 undergoes ON and OFF motions in accordance with signals from the actuating device 30. When the pulse gas valve 29 is opened in an ON state, gas is introduced, and when it is closed in an OFF state, supply of gas is stopped. If evacuation performance is constant, the pressures in the plasma producing chamber 22 and the processing chamber 21 are changed with time in response to the motion of the pulse gas valve 29. Namely, when gas is introduced into the plasma producing chamber 22, the pressure of the chamber is temporarily increased and the pressure difference between the plasma producing chamber 22 and the processing chamber 21 becomes large. Accordingly, it is possible to keep a large pressure difference between the plasma producing chamber 22 and the processing chamber 21 in comparison with the fifth embodiment where gas is constantly supplied. For instance, when gas for etching is supplied in a pulsating manner in the apparatus used in the fifth embodiment, and if the average pressure per time in the plasma producing chamber 22 is determined to be 5 m Torr, the average pressure per time in the processing chamber 21 is about 0.5 m Torr. Thus, there is obtainable a pressure difference in numerical value of one order or more. When a workpiece of large diameter is to be processed, plasma having a large surface area has to be formed in the processing chamber 21. In such case, a predetermined pressure difference can be maintained even when the diameter of the openings 24 of the partition plate 23 is increased and a large number of the openings 24 is formed in the partition plate.

Further, since the atmosphere in the processing chamber 21 can be maintained in a high degree of vacuum, the possibility of collision of plasma particles or random movement of them can be reduced whereby the plasma particles can be irradiated to the workpiece with uniform directivity. Since plasma having a component perpendicular to the surface of the workpiece can be formed, an etching operation perpendicular to the surface of the workpiece and fine processing of less microloading effect are possible.

EMBODIMENT 9

Figure 14:
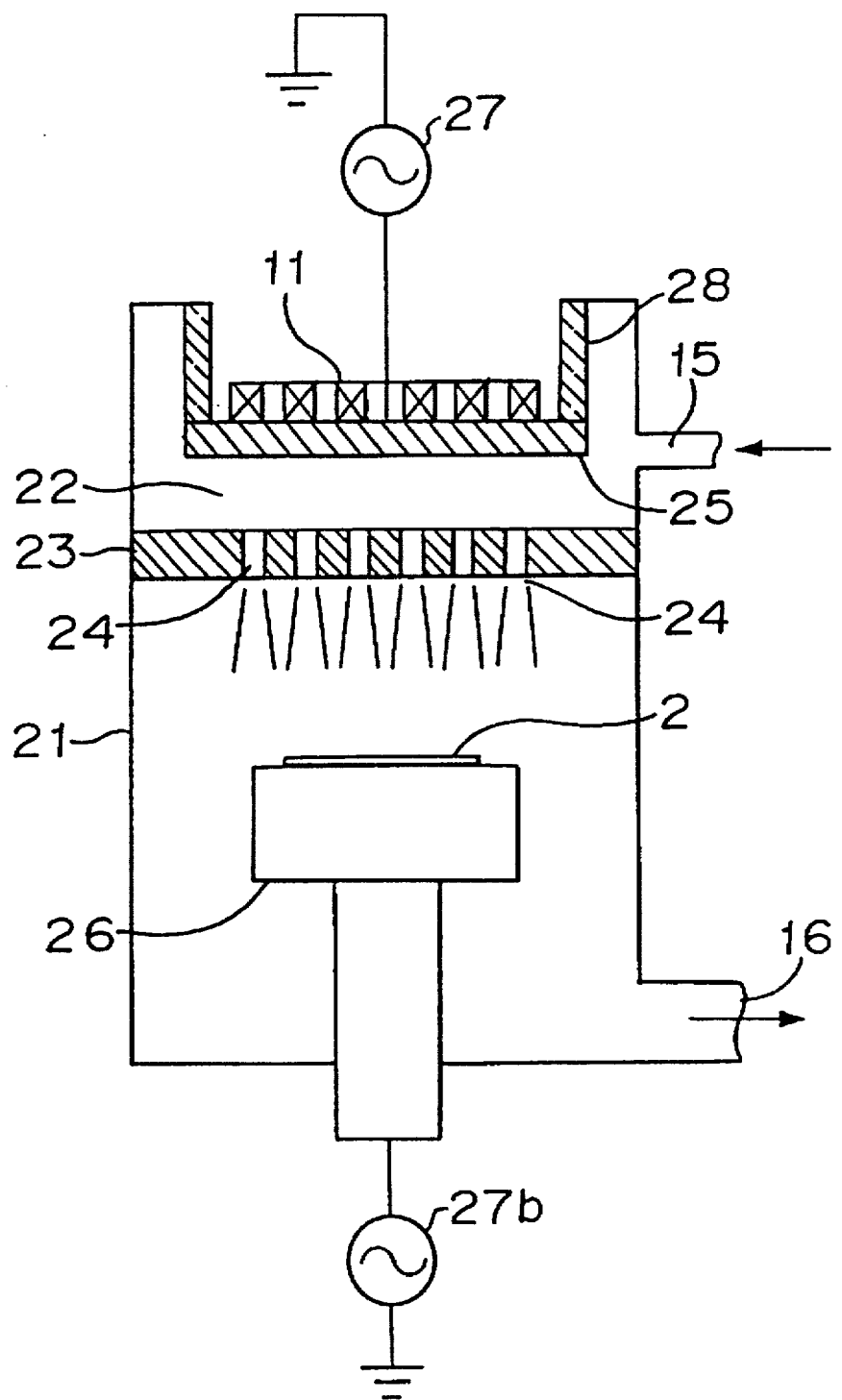
FIG. 14 is a schematic view in cross section of a plasma etching apparatus in accordance with a ninth embodiment of the present invention.
Figure 15:
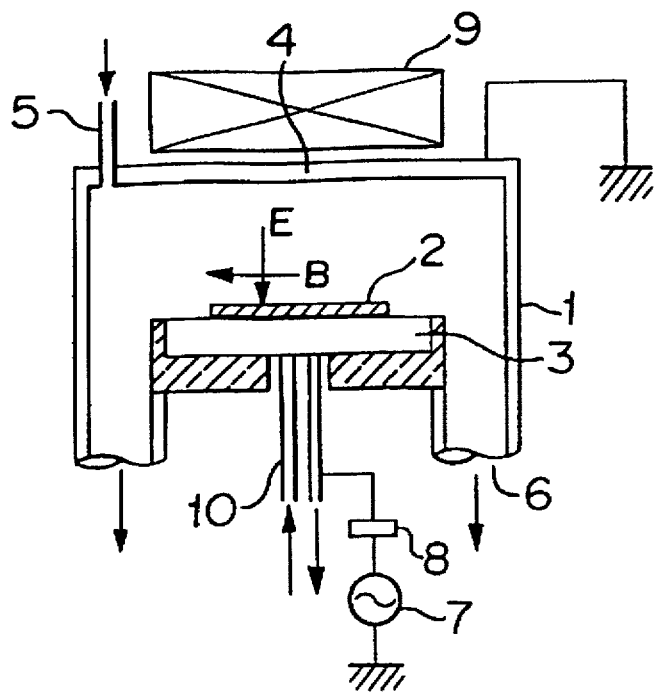
FIG. 15a is a schematic view in cross section of a conventional plasma processing apparatus.
FIG. 15b is a diagram showing a characteristic of the conventional plasma processing apparatus.
Figure 15:
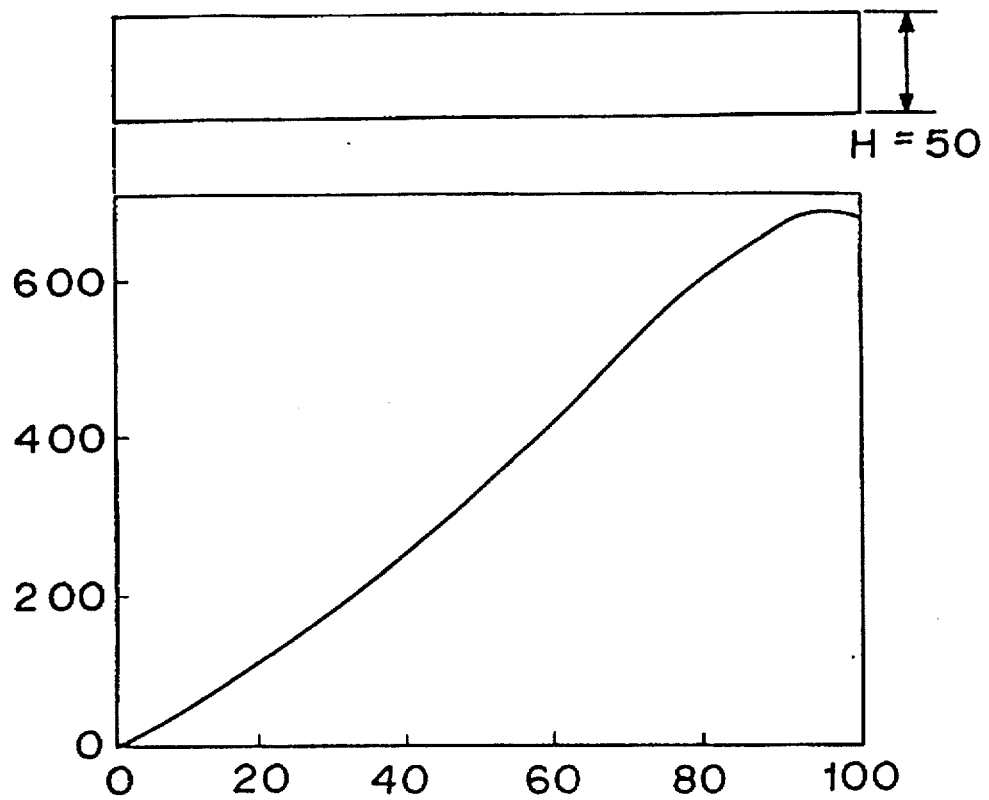
Figure 16:
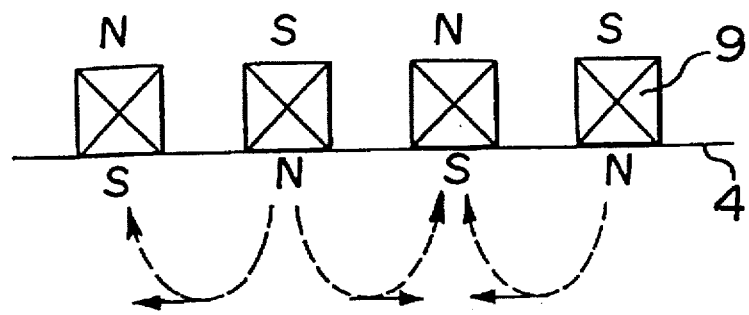
FIG. 16a is a schematic view in cross section of another conventional plasma processing apparatus.
FIG. 16b is a diagram showing a characteristic of the conventional plasma processing apparatus.
Figure 16:
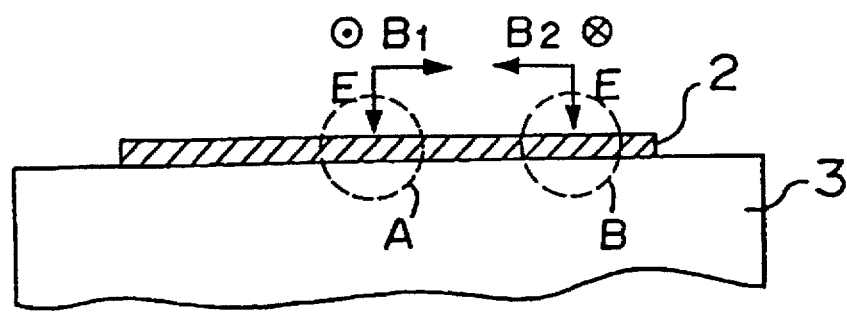
Figure 16:
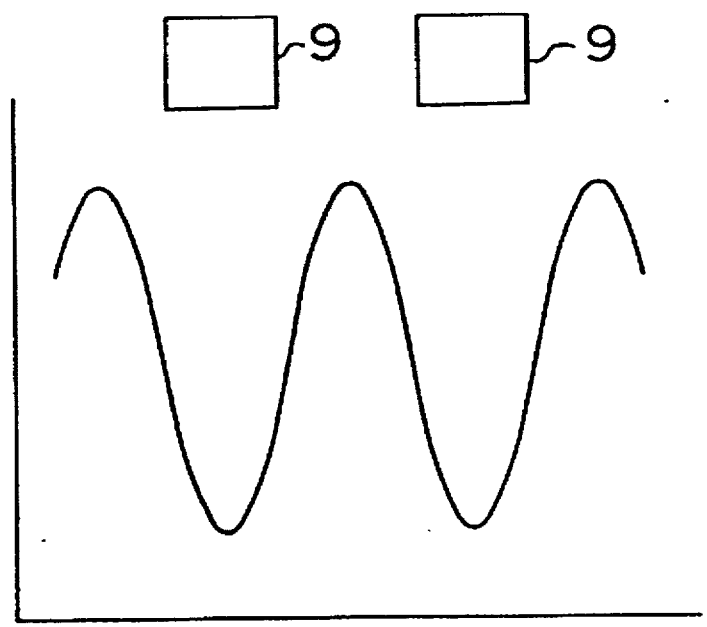
Figure 17:
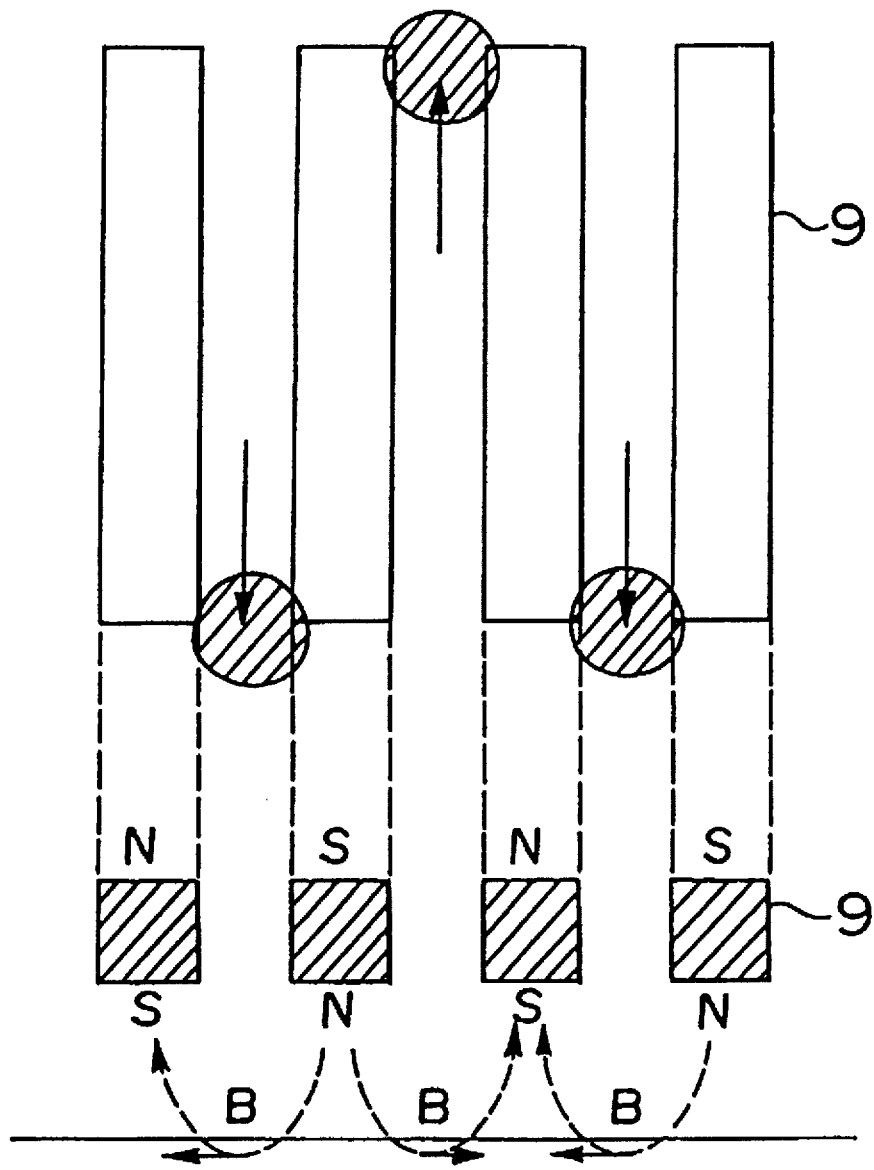
FIG. 17 is a diagram for explaining drifting of plasma in the plasma processing apparatus shown in FIG. 16.
Figure 18:
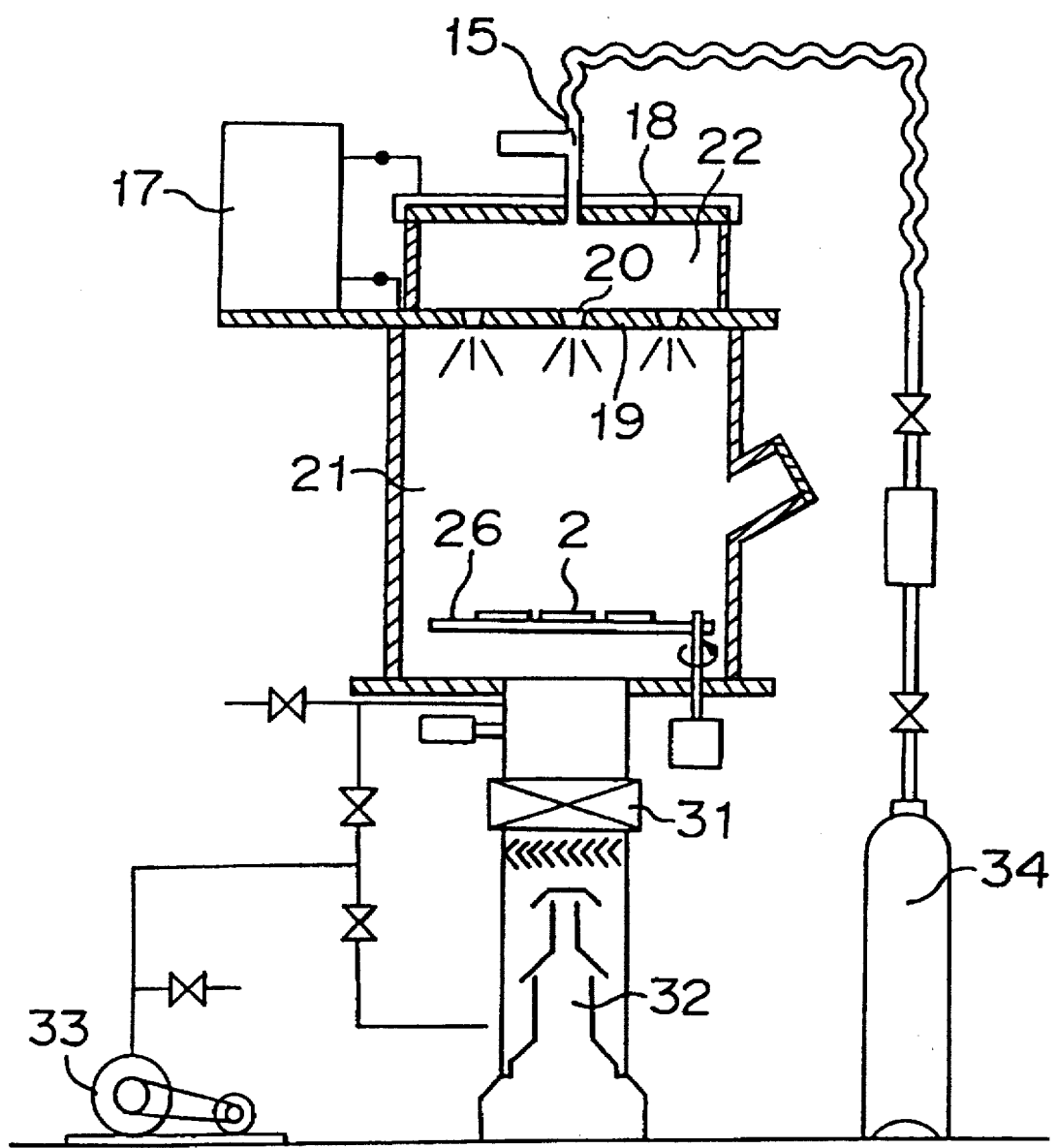
FIG. 18 is a diagram showing a dry etching apparatus in a conventional plasma processing apparatus.

FIG. 14 is a schematic view in cross section of a plasma etching apparatus in accordance with the ninth embodiment of the present invention wherein numeral 27b designates a third high frequency power source connected to the stage 26 which is insulated from the processing chamber 21 with respect to a high frequency power.

In the etching apparatus having the construction described above, etching is conducted in the same manner as the fifth embodiment. Plasma produced in the plasma producing chamber is transported to the processing chamber 21 to etch the workpiece 2. During the supply of the plasma, a high frequency power is applied to the stage 26. Then, the characteristics of the plasma near the workpiece 2 are changed. Namely, when the high frequency power is applied to the workpiece 2, ion energy of the plasma which is a factor for determining the etching characteristics is changed. Thus, by changing the high frequency power applied to the stage 26, the etching characteristics can be optimized depending on the material of the workpiece.

In the above-mentioned embodiments, use of etching apparatuses has been explained. However, the present invention is applicable to a plasma CVD apparatus or a plasma sputtering apparatus to obtain the same effect. For instance, when $SiH_4$ of silane type is introduced as a CVD gas, the gas is decomposed by electric discharge so that a deposited layer of silicon is formed on the workpiece.

In the first construction of the plasma processing apparatus of the present invention, since a plurality of permanent magnets are formed in a ringed shape and they are arranged concentrically, a component of magnetic field in the circumferential direction, which corresponds to the diameter of a workpiece, in all components of magnetic field formed near the workpiece is eliminated whereby a uniform magnetic field can be formed in the circumferential direction and plasma is produced uniformly in that direction. Since charged particles drift in the circumferential direction, the density of plasma in the same circumferential direction is uniform, and the plasma is made uniform due to diffusion of plasma. Further, since the polarities opposing in the radial direction of adjacent magnets are so determined as to be opposite to each other, and the distance of the permanent magnets and the surface magnetic field intensity are suitably selected, the position of a peak or peaks of the magnetic field distributed in a wavy form in the radial direction of the magnetic field can be controlled. Further, the difference of magnetic field intensities in the radial direction can be made small whereby the plasma is further uniform. Further, it is possible to produce plasma uniformly throughout a large surface area.

In accordance with the second construction of the present invention, in addition to the first construction, in addition to the first or second construction, the magnetic field intensity formed by the magnets is made large as 100 Gausses or more at its maximum value around the second electrode. Accordingly, a loss of plasma can be reduced to thereby maintain plasma of high density. In addition, since the magnetic field intensity is made low as 20 Gausses or less around the first electrode, the workpiece can be processed to obtain a product of high quality with less damage by etching, and therefore, it is possible to prevent a damage to a device formed on the workpiece. A workpiece having a large diameter can be processed uniformly without damage.

In accordance with the third construction, in addition to the first or second construction, a magnet of rectangular prism form or cylindrical form is disposed at the central portion of the ring-shaped magnets. Accordingly, the magnetic field intensity at the central portion of the ring-shaped magnets can be increased and the intensity of the magnetic field in the radial direction can be further uniform whereby plasma can be formed uniformly to allow a workpiece of large diameter to be processed uniformly.

In accordance with the fourth construction, in addition to the second construction, the surface magnetic field intensity of the magnet disposed at the central portion of the ring-shaped magnets is made larger than the surface magnetic field intensity of the ring-shaped magnets. Accordingly, the magnetic field intensity at the central portion of the ring-shaped magnets can be further increased. The intensity of the magnetic field in the radial direction is further uniform. Plasma can be formed uniformly and a workpiece of large diameter can be processed uniformly.

In accordance with the fifth construction, in addition to any of the first through fourth constructions, circumferential wall magnets are disposed in positions corresponding to the space formed between the first and second electrodes opposing each other and at outer circumferential portions surrounding the electrodes, and in a manner that the polarity of each of the circumferential wall magnets is the same as that of the outermost ring-shaped magnet, whereby a loss of plasma in the circumferential direction can be reduced. This improves uniformity of the density of plasma and the workpiece can be processed uniformly.

Further, in accordance with the sixth construction of the present invention, since a plasma producing chamber for producing plasma and a processing chamber in which a workpiece is disposed are separated by means of a partition plate having a plurality of openings wherein the plasma is produced in an electric field caused by a high frequency electric power and a magnetic field caused by magnets, the density of plasma produced can be increased, and the workpiece can be rapidly processed in the processing chamber kept at a condition of high degree of vacuum.

In accordance with the seventh construction, in addition to the sixth construction, a high frequency electric power is applied to an electrode in the plasma producing chamber, which is at a position opposing the partition plate, and a plurality of ring-shaped magnets each having the same polarity in its circumferential direction are concentrically arranged at the rear surface side of the electrode so that the polarities opposing in the radial direction of adjacent ring-shaped magnets are opposite to each other. Accordingly, plasma of high density can be produced uniformly throughout a large surface area. As a result, a workpiece of large diameter can be uniformly and rapidly processed under a high vacuum condition.

In accordance with the eighth construction, in addition to the sixth construction, a first high frequency power is applied to the electrode placed opposing the partition plate and a second high frequency power is applied to the partition plate. Accordingly, plasma is produced near the partition plate to which the second high frequency power is applied, whereby the density of plasma can further be increased. Therefore, a workpiece can be processed at a high speed.

In accordance with the ninth construction, in addition to the sixth construction, a high frequency electric power is applied to the partition plate, and a plurality of ring-shaped magnets each having the same polarity in its circumferential direction are concentrically arranged at a position opposing the partition plate in the plasma producing chamber so that the polarities opposing in the radial direction of adjacent ring-shaped magnets are opposite to each other. Accordingly, plasma of high density can be uniformly produced throughout a large surface area. As a result, a workpiece of large diameter can be uniformly and rapidly processed under a high vacuum condition.

In accordance with the tenth construction, in addition to any of the sixth through ninth constructions, gas is introduced into the plasma producing chamber in a pulsating manner. Accordingly, plasma having a large surface area can be transported to the processing chamber while a predetermined difference of pressure between the plasma producing chamber and the processing chamber is maintained. Accordingly, a workpiece of large diameter can be processed.

In accordance with the eleventh construction, in addition to any of the sixth through the tenth constructions, ion energy incident to the workpiece and an amount of the plasma can be controlled by applying a high frequency electric power to the workpiece. Accordingly, the etching characteristics can be optimized depending on material for the workpiece.

Obviously, numerous modifications and variations of the present invention are possible in light of the above teachings. It is therefore to be understood that within the scope of the appended claims, the invention may be practiced otherwise than as specifically described herein.

What is claimed is:

1. A plasma processing apparatus comprising:
   a first electrode on which a workpiece is placed;
   a second electrode located so as to face said first electrode;
   a plurality of ring-shaped magnets disposed on an outer surface of said second electrode and facing said first electrode, each of said magnets having the same polarity in its circumferential direction, and said plurality of ring-shaped magnets being concentrically arranged so that the polarities of adjacent magnets of said plurality of ring-shaped magnets are opposite to each other in the radial direction.

2. A plasma processing apparatus according to claim 1, wherein the intensity of a magnetic field formed by said plurality of ring-shaped magnets near said second electrode is 100 Gausses or more in its maximum value, and the intensity of a magnetic field formed by said plurality of ring-shaped magnets near said first electrode is 20 Gausses or less in its maximum value.

3. A plasma processing apparatus according to claim 2, wherein a second magnet is disposed at the central portion of the ring-shaped magnets.

4. A plasma processing apparatus according to claim 3, wherein the intensity of the magnetic field at the front surface of the second magnet disposed at the central portion of the ring-shaped magnets is greater than the intensity of the magnetic field of the ring-shaped magnets.

5. A plasma processing apparatus according to claim 1, wherein each of said plurality of ring-shaped magnets is comprised of a plurality of rectangular prism magnets arranged in a ring-shaped form.

6. A plasma processing apparatus according to claim 1, wherein a plurality of bar magnets are disposed on a circumferential wall of said processing apparatus.

7. A plasma processing apparatus according to claim 1, wherein said first electrode and said second electrode each have a separate power source.

8. A plasma processing apparatus according to claim 1, further comprising a reactant gas inlet which is disposed within said plurality of ring-shaped magnets.

9. A plasma processing apparatus comprising:
   a plasma producing chamber for producing plasma;
   magnetic means attached to an upper surface of said plasma producing chamber, and
   a processing chamber in which a workpiece is placed and which is partitioned by a partition plate having a plurality of openings from the plasma producing chamber, wherein a uniform distribution of plasma is produced in said plasma processing apparatus by supplying high frequency electric power and by applying a magnetic field formed by said magnetic means.

10. A plasma processing chamber according to claim 9, wherein an electrode is disposed in the plasma producing chamber to face the partition plate so that a high frequency electric power is applied to the electrode; said magnetic means is composed of a plurality of ring-shaped magnets each having the same polarity in its circumferential direction, and the ring-shaped magnets are disposed concentrically at the rear side of the electrode so that the polarities opposing in the radial direction of adjacent ring-shaped magnets are opposite to each other.

11. A plasma processing apparatus according to claim 10, wherein the electrode disposed to face the partition plate is applied with a first high frequency electric power, and the partition plate is applied with a second high frequency electric power.

12. A plasma processing apparatus according to claim 9, wherein the partition plate is applied with a high frequency electric power; said magnetic means is composed of a plurality of ring-shaped magnets each having the same polarity in its circumferential direction, and the ring-shaped magnets are disposed concentrically in the plasma producing chamber at a position opposing the partition plate so that the polarities opposing in the radial direction of adjacent ring-shaped magnets are opposite to each other.

13. A plasma processing apparatus according to claim 9, further comprising means for supplying a gas to the plasma producing chamber as a series of pulses.

14. A plasma processing apparatus according to claim 10, further comprising means for supplying a gas to the plasma producing chamber as a series of pulses.

15. A plasma processing apparatus according to claim 11, further comprising means for supplying a gas to the plasma producing chamber as a series of pulses.

16. A plasma processing apparatus according to claim 9, wherein high frequency electric power is applied to a stage on which the workpiece is placed.

17. A plasma processing apparatus according to claim 10, wherein high frequency electric power is applied to a stage on which the workpiece is placed.

18. A plasma processing apparatus according to claim 11, wherein high frequency electric power is applied to a stage on which the workpiece is placed.

19. A plasma processing apparatus according to claim 13, wherein high frequency electric power is applied to a stage on which the workpiece is placed.

20. A plasma processing apparatus according to claim 14, wherein high frequency electric power is applied to a stage on which the workpiece is placed.

21. A plasma processing apparatus according to claim 15, wherein high frequency electric power is applied to a stage on which the workpiece is placed.

* * * * *